(12) United States Patent
Kadota et al.

(10) Patent No.: US 7,208,860 B2
(45) Date of Patent: *Apr. 24, 2007

(54) SURFACE ACOUSTIC WAVE DEVICE

(75) Inventors: Michio Kadota, Kyoto (JP); Takeshi Nakao, Nagaokakyo (JP); Masakazu Mimura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/268,274

(22) Filed: Nov. 3, 2005

(65) Prior Publication Data

US 2006/0055283 A1 Mar. 16, 2006

Related U.S. Application Data

(63) Continuation of application No. 10/270,207, filed on Oct. 12, 2002, now Pat. No. 7,034,433.

(30) Foreign Application Priority Data

Oct. 12, 2001 (JP) ............................. 2001-315181
Oct. 4, 2002 (JP) ............................. 2002-291991

(51) Int. Cl.
*H01L 41/08* (2006.01)
(52) U.S. Cl. .................................. 310/313 A
(58) Field of Classification Search ............ 310/313 A, 310/313 B, 313 D, 313 R
See application file for complete search history.

(56) References Cited

U.S. PATENT DOCUMENTS 3,965,444 A 6/1976 Willingham et al.
4,978,879 A 12/1990 Satoh et al.
5,818,146 A 10/1998 Kurahashi et al.
5,838,089 A 11/1998 Dreifus et al.

(Continued)

FOREIGN PATENT DOCUMENTS

JP 61-136312 6/1986

(Continued)

OTHER PUBLICATIONS

Campbell et al., "A Method for Estimating Optimal Crystal Cuts and Propagation Directions for Excitation of Piezoelectric Surface Waves"; IEEE Transactions on Sonics and Ultrasonics, vol. SU-15, No. 4, Oct. 1968, pp. 209-217.

(Continued)

*Primary Examiner*—Mark Budd
(74) *Attorney, Agent, or Firm*—Keating & Bennett, LLP

(57) ABSTRACT

A surface acoustic wave device has a high electromechanical coefficient and reflection coefficient, and also has an improved frequency-temperature characteristic that is achieved by forming a $SiO_2$ film on an IDT so as to prevent cracking from occurring on a surface of the $SiO_2$ film so that desired properties can be reliably obtained. The surface acoustic wave device includes at least one IDT, which is composed of a metal or an alloy having a density higher than that of Al and is formed on a 25° to 55° rotation-Y plate X propagation $LiTaO_3$ substrate, and a $SiO_2$ film disposed on the $LiTaO_3$ substrate so as to cover the at least one IDT for improving the frequency-temperature characteristic.

17 Claims, 25 Drawing Sheets

U.S. PATENT DOCUMENTS 6,429,569 B1 8/2002 Kadota
6,580,198 B2 6/2003 Nakano et al.
6,677,696 B1 1/2004 Ruile

FOREIGN PATENT DOCUMENTS

JP 02-295212 12/1990
JP 06-164306 6/1994
JP 11-186866 7/1999

OTHER PUBLICATIONS

Kawachi et al., "Optimum Cut of LiTaO3 for High Performance Leaky Surface Acoustic Wave Filters"; 1996 IEEE Ultrasonics Symposium, pp. 71-76.

Kadota et al.; Currently pending U.S. Appl. No. 10/270,207, filed Oct. 12, 2002; Mikio Kadota et al.; "Surface Acoustic Wave Device".

BEFORE FILM FORMATION

Au/LT

AFTER FILM FORMATION

× 20000

SiO$_2$/Au/LT

BEFORE SiO₂ FILM FORMATION

IDT/ substrate

AFTER SiO₂ FILM FORMATION ($SiO_2$ H/$\lambda$ =0.3)

LARGE STEP

SURFACE ACOUSTIC WAVE DEVICE

This application is a Continuation application of U.S. patent application Ser. No. 10/270,207 filed Oct. 12, 2002, now U.S. Pat. No. 7,034,433.

BACKGROUND OF THE INVENTION

1. Field of the Invention

The present invention relates surface acoustic wave devices used for resonators, bandpass filters, and other such devices, and more particularly, relates to a surface acoustic wave device using a rotation-Y plate X propagation LiTaO$_3$ substrate and a method for manufacturing the same.

2. Description of the Related Art

In mobile communication apparatuses such as mobile phones, surface acoustic wave filters have been used, for example, as bandpass filters or duplexers in the RF stage. As this type of surface acoustic wave filter, surface acoustic wave filters using a leakage surface acoustic wave, which filters are each formed of an IDT (interdigital transducer) made of Al and provided on a 36° to 46° rotation-Y plate X propagation LiTaO$_3$ substrate, have been used.

However, this surface acoustic wave filter has a poor frequency-temperature characteristic of −30 ppm/° C. to −40 ppm/° C., and hence it is necessary to improve the frequency-temperature characteristic. Accordingly, in order to improve the frequency-temperature characteristic, a resonator has been proposed having the structure in which after an IDT composed of Al having a normalized thickness of 0.01 to 0.04 is formed on a 36° rotation-Y plate X propagation (Euler angles: 0°, 126°, 0°) LiTaO$_3$ substrate, a SiO$_2$ film is further provided thereon (for example, in patent publication 1 discussed below). In this structure, by forming the SiO$_2$ film, the frequency-temperature characteristic is improved.

However, when IDTs are formed by using Al so as to produce filters, in order to obtain a sufficiently high reflection coefficient or electromechanical coefficient K$_{saw}$, the IDT must have a relatively large electrode thickness H/λ (H indicates the thickness, and λ indicates the wavelength of a surface acoustic wave) of 0.08 to 0.10 (for example, in literature 2 discussed below).

Patent Publication 1 to be discussed herein refers to Japanese Unexamined Patent Application Publication No. 1990-295212 and Literature 2 to be discussed herein refers to O. Kawachi et al. "Optimum Cut of LiTaO$_3$ for High Performance Leaky Surface Acoustic Wave Filters" Proc. 1996 IEEE Ultrasonic Symp. pp. 71–76.

As described above, since the IDT composed of Al has a relatively large thickness, when a SiO$_2$ film is formed at parts shown in FIG. 25(A) for improving the frequency-temperature characteristic, as shown in FIGS. 25(B) and (C), large steps are formed by the SiO$_2$ film. As a result, cracks may be generated therein in some cases. Accordingly, due to the generation of the cracks, filter characteristics of the surface acoustic wave filter are degraded.

In addition, since the electrode of the IDT composed of Al is relatively large, an effect of covering the irregularities of the electrode surface of the IDT cannot be satisfactorily obtained by forming the SiO$_2$ film, and hence the temperature characteristics may not be sufficiently improved.

SUMMARY OF THE INVENTION

In order to overcome the problems described above, preferred embodiments of the present invention provide a surface acoustic wave device using a rotation-Y plate X propagation LiTaO$_3$ substrate and a method for manufacturing the same, in which the frequency-temperature characteristic is greatly improved by the formation of a SiO$_2$ film and by decreasing the electrode thickness of IDTs, so that cracks are prevented from being generated in the SiO$_2$ film, the attenuation constant is also significantly decreased, target electrical characteristics such as filter characteristics are achieved, and the electromechanical coefficient and reflection coefficient of the IDT are also increased.

According to a preferred embodiment of the present invention, a surface acoustic wave device includes a 25° to 55° rotation-Y plate (Euler angles of (0°, 115° to 145°, 0°)) LiTaO$_3$ substrate, at least one IDT disposed on the LiTaO$_3$ substrate and made of a metal having a density higher than that of Al, and a SiO$_2$ film disposed on the LiTaO$_3$ substrate so as to cover the IDT.

According to another preferred embodiment of the present invention, a surface acoustic wave device includes a 42° to 50° rotation-Y plate (Euler angles (0°, 132° to 140°, 0°)) LiTaO$_3$ substrate, at least one IDT which is disposed on the LiTaO$_3$ substrate and is composed of a metal having a density higher than that of Al, and a SiO$_2$ film disposed on the LiTaO$_3$ substrate so as to cover the IDT.

According to still another preferred embodiment of the present invention, a surface acoustic wave device includes a 25° to 42° rotation-Y plate (Euler angles (0°, 115° to 132°, 0°)) LiTaO$_3$ substrate, at least one IDT which is disposed on the LiTaO$_3$ substrate and is composed of a metal having a density higher than that of Al, and a SiO$_2$ film disposed on the LiTaO$_3$ substrate so as to cover the IDT.

In preferred embodiments of the present invention, the IDT is preferably made of at least one metal as a primary component selected from the group consisting of Au, Pt, W, Ta, Ag, Mo, Cu, Ni, Co, Cr, Fe, Mn, Zn, and Ti. By using these metals each having a density higher than that of Al, compared to the case of using Al, the electromechanical coefficient and reflection coefficient of the IDT can be increased (see FIGS. 2 and 3 shown below).

According to a more specific preferred embodiment of the present invention, the IDT that is preferably is composed of Au and has a thickness normalized by the wavelength of an acoustic surface wave in the range of about 0.013 to about 0.030, and the thickness of the SiO$_2$ film, which is normalized by the wavelength of the acoustic surface wave, is set in the range of about 0.03 to about 0.45. In this case, according to this preferred embodiment of the present invention, a surface acoustic wave device can be reliably provided in which the electromechanical coefficient and reflection coefficient are high, the frequency-temperature characteristic is superior, the attenuation constant is sufficiently small, and cracking is prevented from occurring in the SiO$_2$ film.

According to still another preferred embodiment of the present invention, the IDT electrode described above is preferably composed of Au or an Au alloy, and the cut angle of the LiTaO$_3$ substrate, the normalized electrode thickness of the IDT, and the normalized thickness of SiO$_2$ are shown by one of the following combinations (a) to (k).

TABLE 3

| | Cut Angle θ | Thickness of Au | Thickness of SiO$_2$ |
|---|---|---|---|
| (a) | 30.0° ≦ θ < 33.0° | 0.013 to 0.018 | 0.15 to 0.45 |
| (b) | 33.0° ≦ θ < 34.5° | 0.013 to 0.022 | 0.10 to 0.40 |
| (c) | 34.5° ≦ θ < 35.5° | 0.013 to 0.025 | 0.07 to 0.40 |
| (d) | 35.5° ≦ θ < 37.5° | 0.013 to 0.025 | 0.06 to 0.40 |
| (e) | 37.5° ≦ θ < 39.0° | 0.013 to 0.028 | 0.04 to 0.40 |

TABLE 3-continued

|  | Cut Angle θ | Thickness of Au | Thickness of SiO₂ |
|---|---|---|---|
| (f) | 39.0° ≦ θ < 40.0° | 0.017 to 0.030 | 0.03 to 0.42 |
|  | → preferably | 0.022 to 0.028 | 0.04 to 0.40 |
| (g) | 40.0° ≦ θ < 41.5° | 0.017 to 0.030 | 0.03 to 0.42 |
|  | → preferably | 0.022 to 0.028 | 0.04 to 0.40 |
| (h) | 41.5° ≦ θ < 43.0° | 0.018 to 0.028 | 0.05 to 0.33 |
| (i) | 43.0° ≦ θ < 45.0° | 0.018 to 0.030 | 0.05 to 0.30 |
| (j) | 45.0° ≦ θ ≦ 47.0° | 0.019 to 0.032 | 0.05 to 0.25 |
| (k) | 47.0° ≦ θ ≦ 50.0° | 0.019 to 0.032 | 0.05 to 0.25 |

According to still another specific preferred embodiment of the present invention, the IDT is composed of Au or an Au alloy, and the cut angle of the LiTaO₃ substrate, the normalized electrode thickness of the IDT, and the normalized thickness of SiO₂ are shown by one of the following combinations (m) to (r).

TABLE 4

|  | Cut Angle θ | Thickness of Au | Thickness of SiO₂ |
|---|---|---|---|
| (m) | 39.0° ≦ θ < 40.0° | 0.022 to 0.028 | 0.04 to 0.40 |
| (n) | 40.0° ≦ θ < 41.5° | 0.022 to 0.028 | 0.04 to 0.40 |
| (o) | 41.5° ≦ θ < 43.0° | 0.022 to 0.028 | 0.05 to 0.33 |
| (p) | 43.0° ≦ θ < 45.0° | 0.022 to 0.030 | 0.05 to 0.30 |
| (q) | 45.0° ≦ θ < 47.0° | 0.022 to 0.032 | 0.05 to 0.25 |
| (r) | 47.0° ≦ θ ≦ 50.0° | 0.022 to 0.032 | 0.05 to 0.25 |

According to still another specific preferred embodiment of the surface acoustic wave device of the present invention, an adhesive layer is formed between the upper surface of the IDT and the SiO₂ film, and this layer prevents film peeling of the SiO₂ film from occurring. In this case, in addition to the upper surface of the IDT, the adhesive layer may also be formed at the interface between the LiTaO₃ substrate and the SiO₂ film. Furthermore, the adhesive layer may be formed at an approximately entire interface between the IDT and the SiO₂ film in addition to the upper surface of the IDT. That is, the adhesive layer may be formed on side surfaces of the IDT.

According to still another specific preferred embodiment of the surface acoustic wave device of the present invention, a plurality of electrodes, which includes at least electrode pads used for electrical connection with a bus bar and external elements, are also provided on the LiTaO₃ substrate. In each of the plurality of electrodes, an underlying metal layer, which is formed of an underlying electrode layer composed of a metal having a density higher than that of Al and an upper metal layer which is formed on the underlying electrode layer and is preferably composed of Al or an Al alloy, can be formed in the same step as that for the IDT. In addition, since the upper metal layer is composed of Al or an Al alloy, the adhesive strength of the SiO₂ film can be increased, and in addition, the cost of the electrodes can be reduced. Furthermore, a wedge-bonding property by Al can also be improved.

In the surface acoustic wave device of preferred embodiments of the present invention, as the surface acoustic wave, a leakage surface acoustic wave is preferably used. According to preferred embodiments of the present invention, a surface acoustic wave device, which includes an IDT provided with a superior frequency-temperature characteristic, a high electromechanical coefficient, and a high reflection coefficient, and which uses a leakage surface acoustic wave having a small propagation constant, can be provided.

A method for manufacturing a surface acoustic wave device, according to another preferred embodiment of the present invention, includes the steps of preparing a 25° to 55° rotation-Y plate (Euler angles (0°, 115° to 145°, 0°)) LiTaO₃ substrate, forming at least one IDT on the LiTaO₃ substrate using a metal having a density higher than that of Al, performing frequency adjustment after the IDT is formed, and forming a SiO₂ film on the LiTaO₃ substrate so as to cover the IDT after the frequency adjustment is performed.

According to one specific preferred embodiment of the manufacturing method of the present invention, as a material for forming the IDT, Au or an alloy primarily composed of Au is preferably used. Since Au has a density higher than that of Al, an IDT having a high electromechanical coefficient and reflection coefficient can be easily formed. In addition, the electrode thickness of the IDT can be decreased and cracks generated in the SiO₂ film are prevented from occurring. Furthermore, the attenuation constant can be decreased by the presence of the SiO₂ film.

The above and other features, elements, characteristics and advantages of the present invention will be clear from the following detailed description of the preferred embodiments of the invention in conjunction with the accompanying drawings.

BRIEF DESCRIPTION OF THE DRAWINGS

FIG. 25(A) shows a state before a SiO$_2$ film is formed, and FIG. 25(B) shows a state of a surface and a cross-section of the SiO$_2$ film after its formation.

DETAILED DESCRIPTION OF PREFERRED EMBODIMENTS

Hereinafter, with reference to the figures, the present invention will be described in conjunction with particular examples of preferred embodiment of the present invention.

Figure 1:
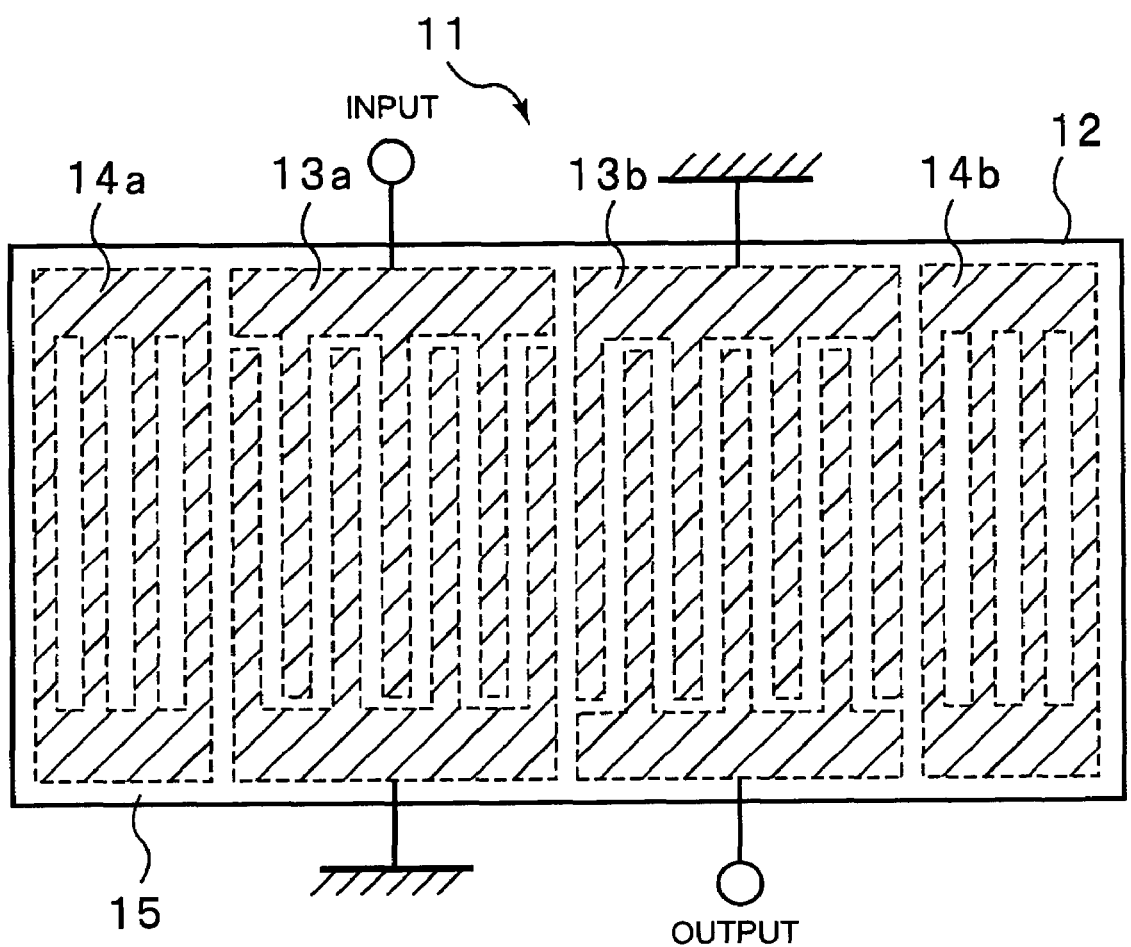
FIG. 1 is a perspective view showing a surface acoustic wave device of one example of preferred embodiments of the present invention.

FIG. 1 is a plan view for illustrating a longitudinally coupled resonant filter as a surface acoustic wave device according to one example of preferred embodiments of the present invention.

A surface acoustic wave device 11 has the structure in which IDTs 13a and 13b and reflectors 14a and 14b are disposed on the upper surface of a LiTaO$_3$ substrate 12. In addition, a SiO$_2$ film 15 is arranged so as to cover the IDTs 13a and 13b and the reflectors 14a and 14b. Related to this, as the LiTaO$_3$ substrate 12, a 25° to 55° rotation-Y plate X propagation (Euler angles (0°, 115° to 145°, 0)) LiTaO$_3$ substrate is preferably used. In a rotation-Y plate X propagation LiTaO$_3$ substrate having a cut angle outside the range described above, the attenuation constant is high, and TCF is also degraded.

The IDTs 13a and 13b and the reflectors 14a and 14b are preferably made of a metal having a density higher than that of Al. As the metal mentioned above, for example, there may be at least one metal selected from the group consisting of Au, Pt, W, Ta, Ag, Mo, Cu, Ni, Co, Cr, Fe, Mn, Zn, and Ti, or an alloy primarily composed of at least one of the metals mentioned above.

Figure 2:
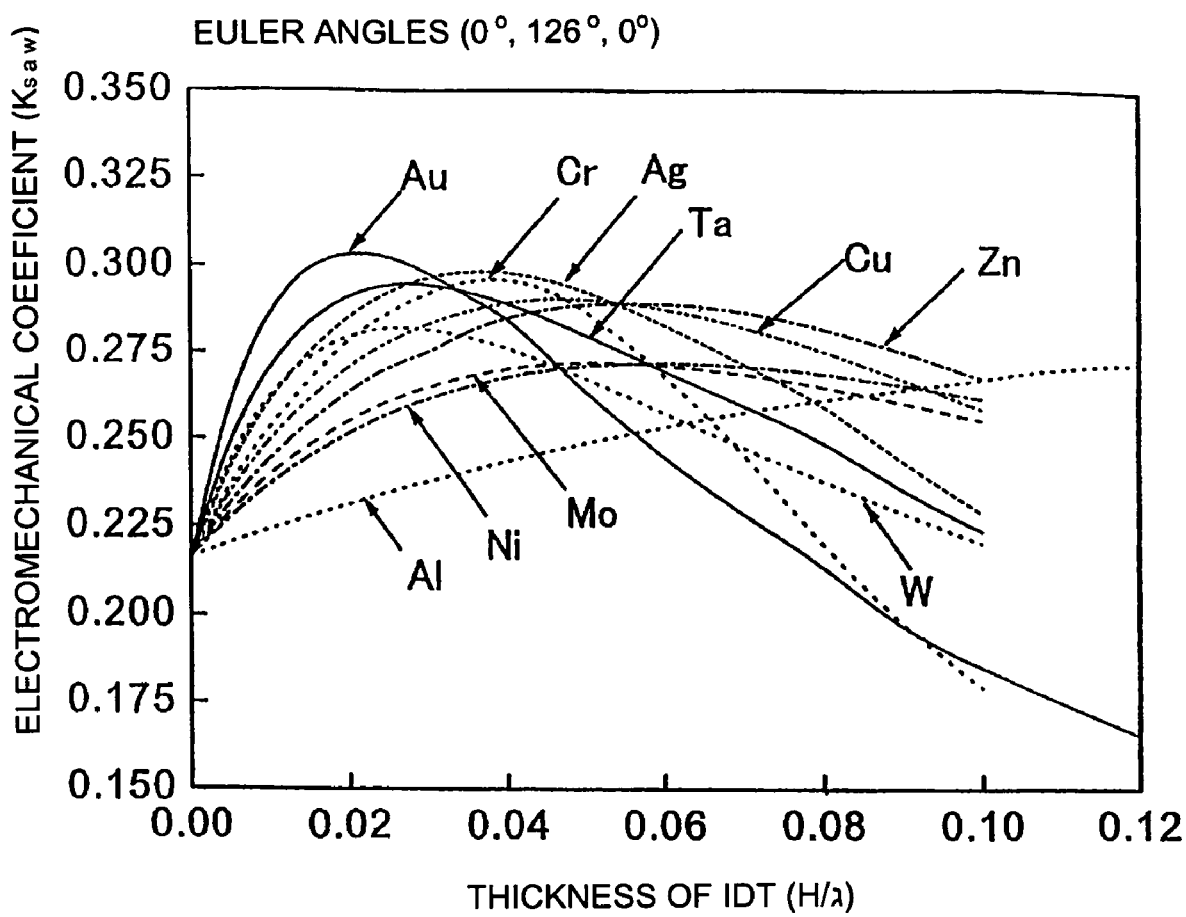
FIG. 2 is a view showing the relationship between the electromechanical coefficient and the normalized electrode thickness of IDTs, the IDTs being composed of Au, Ta, Ag, Cr, W, Cu, Zn, Mo, Ni, and Al and being formed on a 36° rotation-Y plate X propagation (Euler angles (0°, 126°, 0°)) LiTaO₃ substrate.
Figure 3:
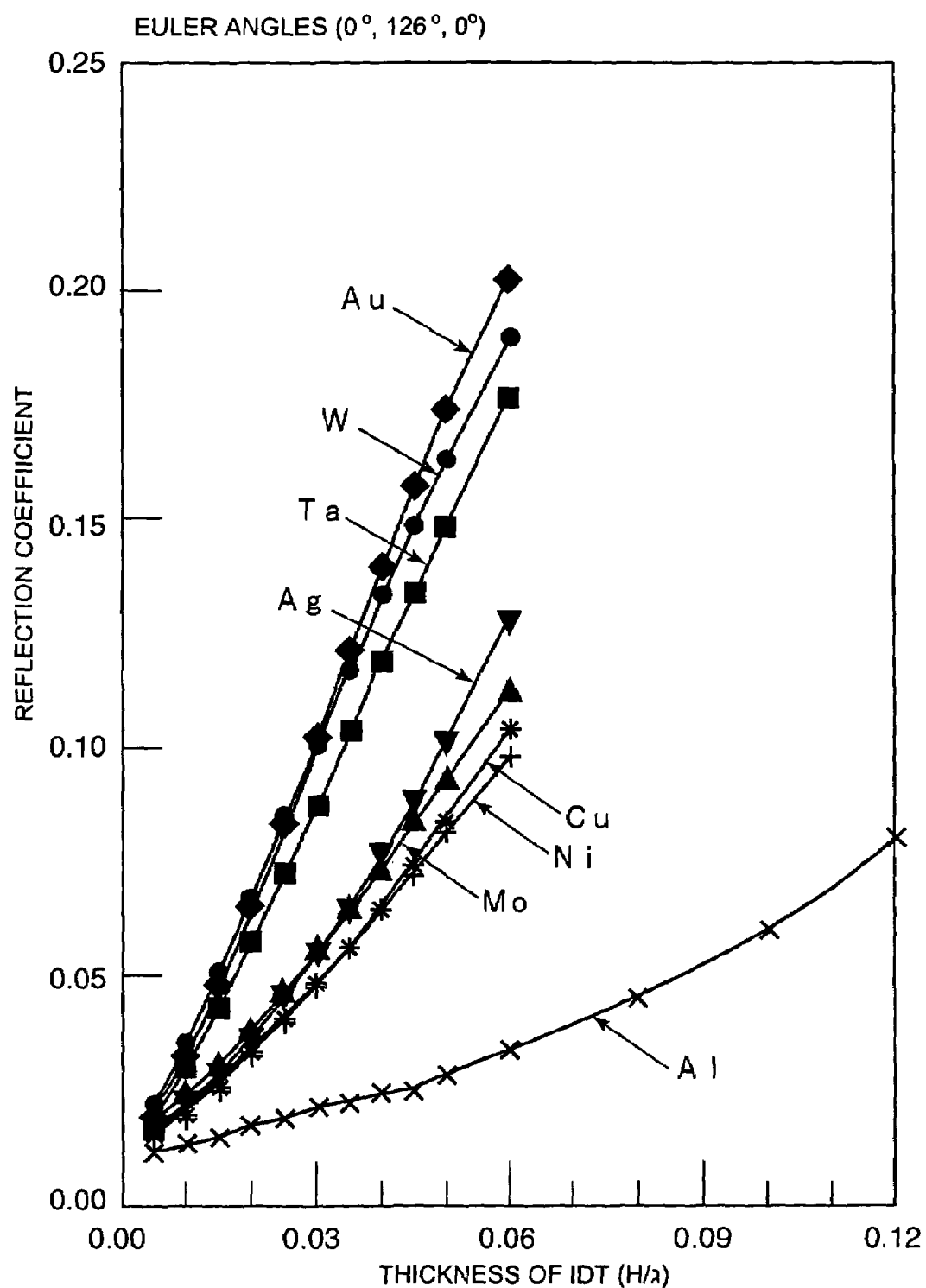
FIG. 3 is a view showing the relationship between the thickness and the reflection coefficient of one side finger electrode of IDTS, the IDTs being composed of various electrode materials and being formed on a 36° rotation-Y plate X propagation (Euler angles (0°, 126°, 0°)) LiTaO₃ substrate.

As described above, since the IDTs 13a and 13b and the reflectors 14a and 14b are preferably made of a metal having a density higher than that of Al, even when the thicknesses are small as compared to the case in which the IDTs 13a and 13b and the reflectors 14a and 14b are composed of Al, as shown in FIGS. 2 and 3, the electromechanical coefficient and reflection coefficient can be increased.

In addition, since the electrode thickness can be decreased as described above, generation of cracks caused by the steps of the SiO$_2$ film 15 formed on the IDTs 13a and 13b is reliably prevented. Concerning the thickness of the SiO$_2$ film 15, as it will be apparent from the experimental examples described later, the thickness H/λ, which is normalized by the wavelength of a surface acoustic wave, is preferably in the range of about 0.03 to about 0.45, where H indicates the thickness, and λ indicates the wavelength of the surface acoustic wave. By being set in the range described above, the attenuation constant can be significantly decreased compared to the case in which the SiO$_2$ film is not provided, and hence low loss can be achieved.

Although depending on a material for forming the IDT, for example, when an Au film is used, the film thicknesses of the IDTs 13a and 13b, normalized by the wavelength of the surface acoustic wave, are preferably in the range of about 0.013 to about 0.030. When the Au film is thin, since the IDT has lead-wire resistance, the film thickness is more preferably in the range of about 0.021 to about 0.03.

In the surface acoustic wave device of preferred embodiments of the present invention, as described above, the IDTs 13a and 13b are preferably made of a metal having a density higher than that of Al, and the electrode thicknesses of the IDTs 13a and 13b can be decreased. Accordingly, the generation of the steps of the $SiO_2$ film does not occur, and hence cracking can be reliably prevented. In addition, the attenuation constant can be significantly decreased by the $SiO_2$ film, and hence low loss can be achieved. Hence, superior properties can be obtained, and by the formation of the $SiO_2$ film 15, a preferable frequency-temperature characteristic can be realized. Hereinafter, the advantages described above will be described with reference to particular examples.

Figure 4:
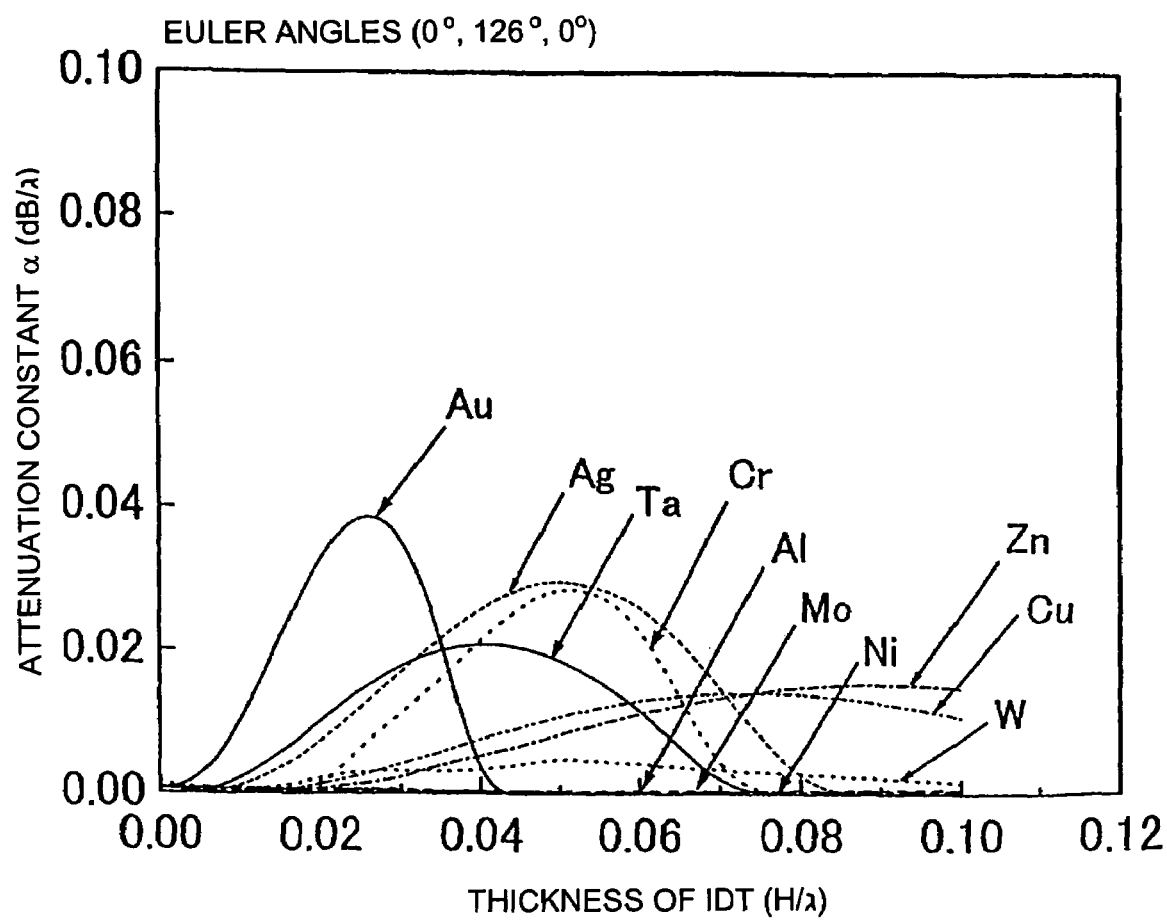
FIG. 4 is a view showing the relationship between the normalized electrode thickness and the attenuation constant of IDTs, the IDTs being composed of Au, Ta, Ag, Cr, W, Cu, Zn, Mo, Ni, and Al and being formed on a 36° rotation-Y plate X propagation (Euler angles (0°, 126°, 0°)) LiTaO₃ substrate.

The changes in electromechanical coefficient $K_{saw}$, attenuation constant (α), and reflection coefficient |refl| are shown in FIGS. 2, 3, and 4, respectively, in the case in which an IDT composed of Al and IDTS composed of Au, Ta, Ag, Cr, W, Cu, Zn, Mo, and Ni are formed on a 36° rotation-Y plate X propagation $LiTaO_3$ substrate so as to have various thicknesses. Related to this, calculation of numerical values was performed in accordance with the method described in J. J. Campbell and W. R. Jones: IEEE Trans. Sonic & Ultrasonic. SU-15. p209 (1968), and the calculation was performed on the assumption that the electrodes are uniform on the entire surface.

As can be seen from FIG. 2, in the IDT composed of Al, when the normalized thickness H/λ is about 0.10, the electromechanical coefficient is approximately 0.27. In the case described above, H indicates the thickness, and λ indicates the wavelength of a surface acoustic wave. On the contrary, when the IDTs composed of Au, Ta, Ag, Cr, W, Cu, Zn, Mo, and Ni have the H/λ set in the range of from about 0.013 to about 0.035, an even higher electromechanical coefficient $K_{saw}$ can be realized. However, as can be seen in FIG. 4, regardless of the film thickness H/λ, compared to the case in which the IDT composed of Al has an attenuation constant (α) of approximately zero, the attenuation constants of the IDTs composed of Au, Ta, Ag, Cr, W, Cu, Zn, Mo, and Ni become very high.

Figure 12:
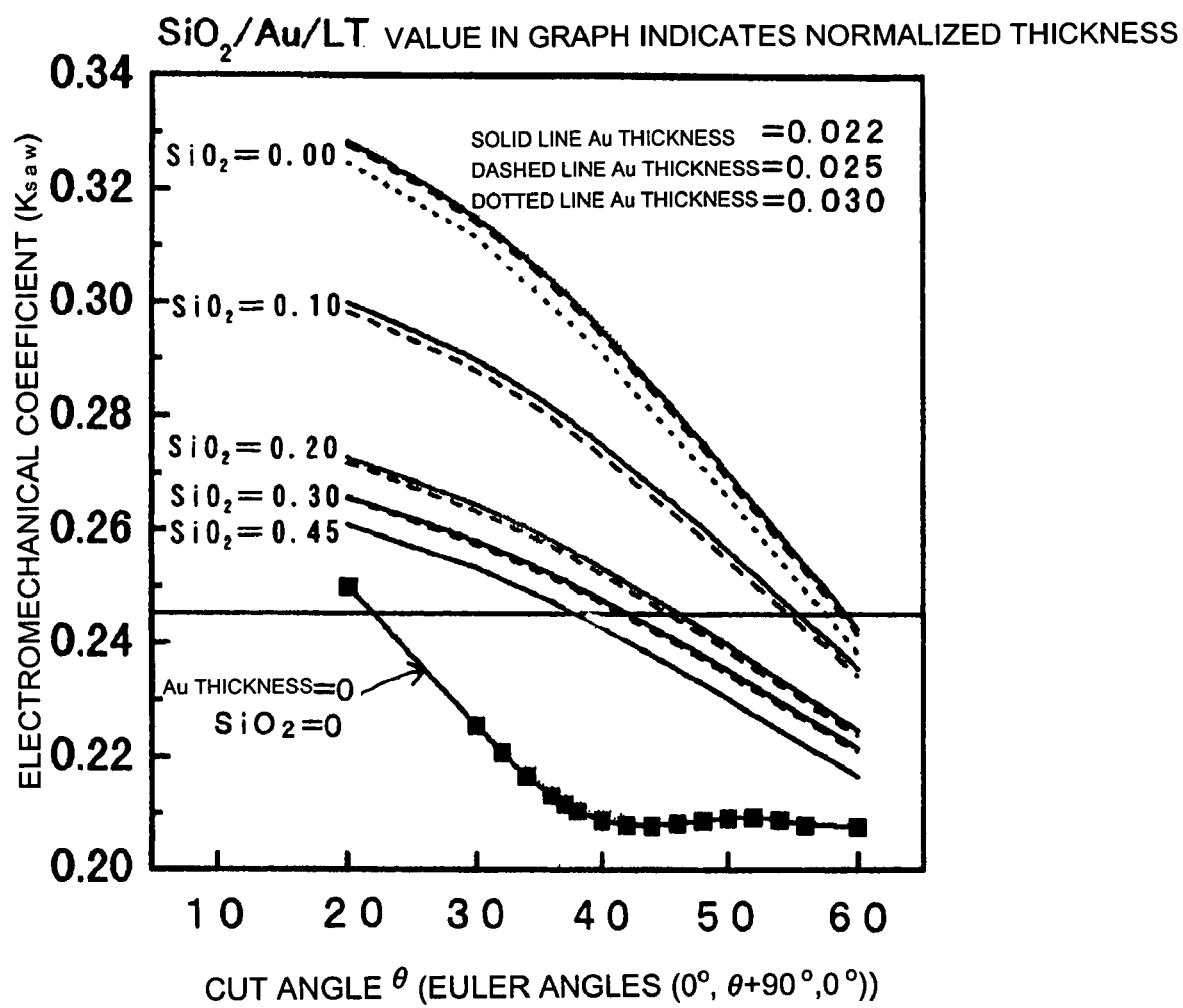
FIG. 12 is a view showing the change in electromechanical coefficient when the normalized thickness of an IDT composed of Au and having a cut angle θ (Euler angles (0°, θ+90°, 0°)) and the normalized thickness of a SiO$_2$ film are changed.

In addition, FIG. 12 is a view showing the relationship between the electromechanical coefficient and θ in the structure in which an IDT composed of Au and a $SiO_2$ film are formed on a $LiTaO_3$ substrate having a cut angle θ (Euler angles (0°, θ+90°, 0°). In this case, the normalized thickness of the IDT composed of Au was set to approximately 0.022, 0.025, and 0.030, and the $SiO_2$ films were formed having a normalized thickness of 0.00 (no $SiO_2$ film formation), and approximately 0.10, 0.20, 0.30, and 0.45.

As can be seen in FIG. 12, it is understood that the electromechanical coefficient $K_{saw}$ is decreased concomitant with the increase in thickness of the $SiO_2$ film. In addition, as described later, in order to suppress the properties degradation caused by the $SiO_2$ film, the case in which the film thickness of the IDT is decreased is considered. As can be seen in FIG. 2 described above, when the normalized thickness of a conventional IDT composed of Al is decreased to about 0.04, although the $SiO_2$ film is not formed, the electromechanical coefficient $K_{saw}$ is decreased to about 0.245. In addition, when the normalized thickness of the IDT composed of Al is set to about 0.04, and the $SiO_2$ film is formed, the electromechanical coefficient $K_{saw}$ is further decreased, and hence broad-band characteristics cannot be practically obtained.

On the contrary, as can be seen in FIG. 12, in the structure in which the IDT is composed of Au, and the $SiO_2$ film is formed, when the cut angle is set to about 38.5° or less, it is found that the electromechanical coefficient $K_{saw}$ is about 0.245 or more although the normalized thickness of the $SiO_2$ film is set to approximately 0.45. In addition, when a $SiO_2$ film having a normalized thickness of approximately 0.30 is formed, by setting the cut angle θ to 42° or less, S electromechanical coefficient $K_{saw}$ can be about 0.245 or more. Related to this, as described later, when the cut angle is less than 25°, the attenuation constant is increased and hence cannot be practically used. Accordingly, it is understood that a 25° to 42° rotation-Y plate X propagation $LiTaO_3$ substrate (Euler angles (0°, 115° to 132°, 0°)) is preferably used, and a 25° to 38.5° rotation-Y plate X propagation $LiTaO_3$ substrate (Euler angles (0°, 115° to 128.5°, 0°)) is more preferably used.

Figure 5:
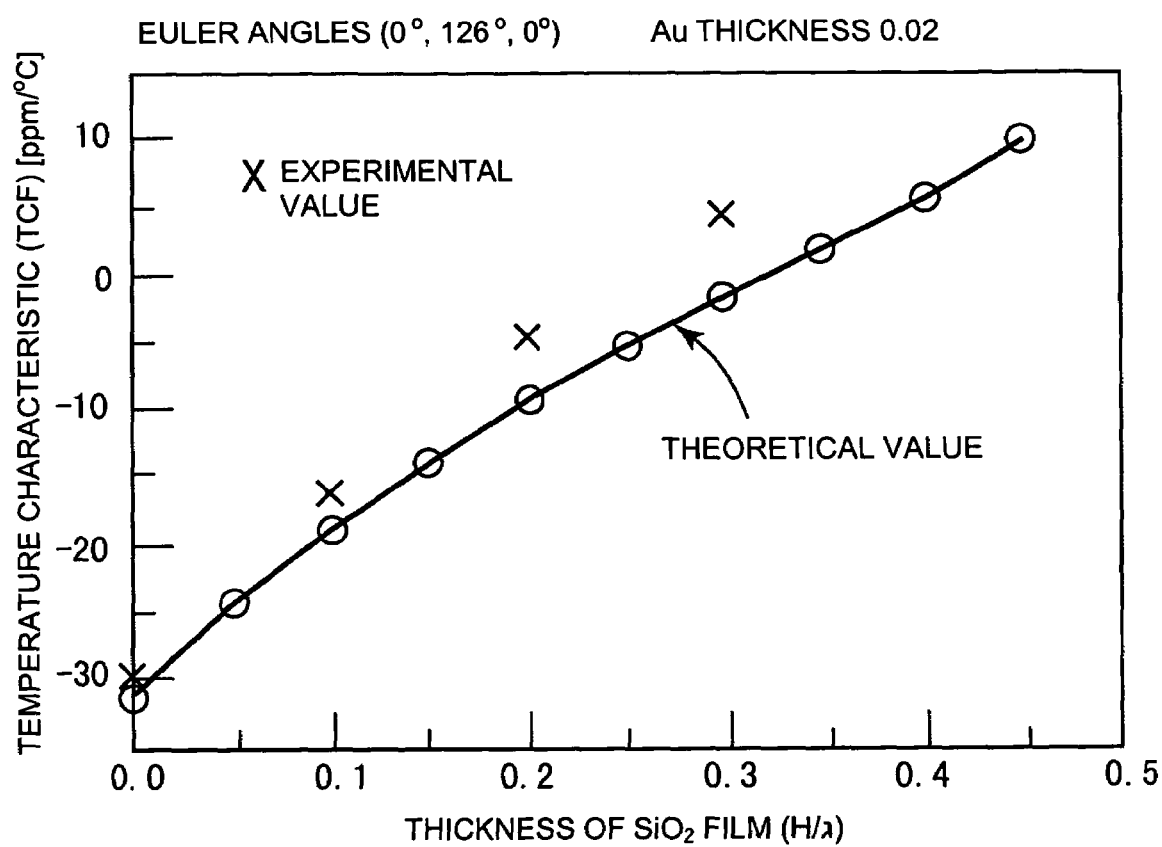
FIG. 5 is a view showing the change in frequency-temperature characteristic (TCF) when an IDT composed of Au and having a normalized thickness of 0.02 is formed on a 36° rotation-Y plate X propagation (Euler angles (0°, 126°, 0°)) LiTaO₃ substrate, and SiO₂ films having various thicknesses are formed thereon.

On the other hand, the frequency-temperature characteristic (TCF) of a 36° rotation-Y plate X propagation $LiTaO_3$ substrate was −30 ppm/° C. to −40 ppm/° C. and is not satisfactory. In order to improve this frequency-temperature characteristic, on a 36° rotation-Y plate X propagation $LiTaO_3$ substrate, an IDT composed of Au is formed, and $SiO_2$ films having various thicknesses are further formed. The changes in frequency-temperature characteristic thereof are shown in FIG. 5. In FIG. 5, ○ indicates a theoretical value, and × indicates an experimental value. In this example, the normalized thickness H/λ of the IDT composed of Au is about 0.020.

As can be seen in FIG. 5, it is understood that the frequency-temperature characteristic can be improved by the formation of the $SiO_2$ film. In particular, when the normalized thickness H/λ of the $SiO_2$ film is approximately 0.25, it is understood that the TCF preferably becomes zero.

Figure 6:
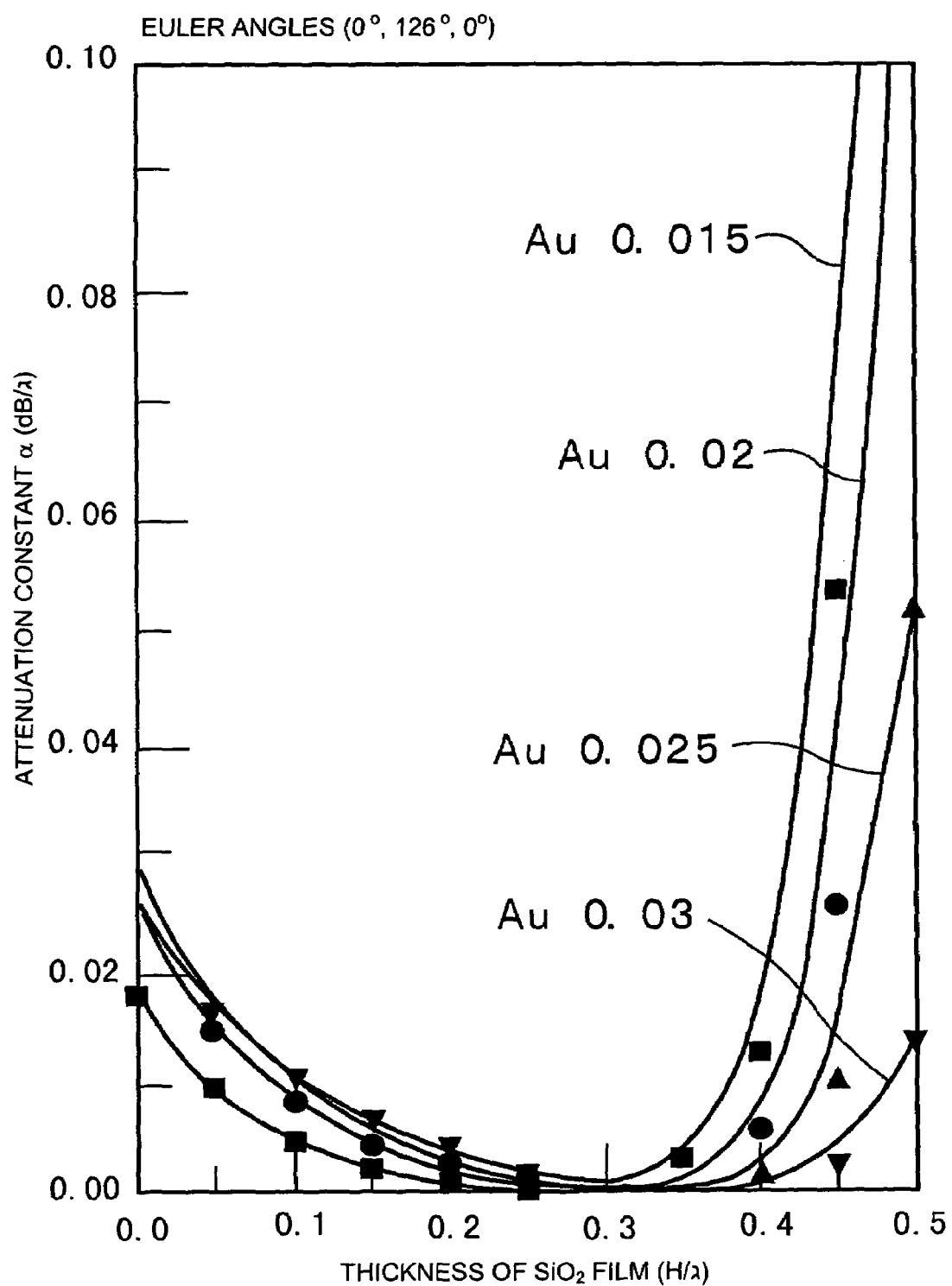
FIG. 6 is a view showing the change in attenuation constant α when IDTs composed of Au and having various thicknesses are each formed on a 36° rotation-Y plate X propagation (Euler angles (0°, 126°, 0°)) LiTaO₃ substrate, and SiO₂ films having various normalized thicknesses are formed thereon.
Figure 7:
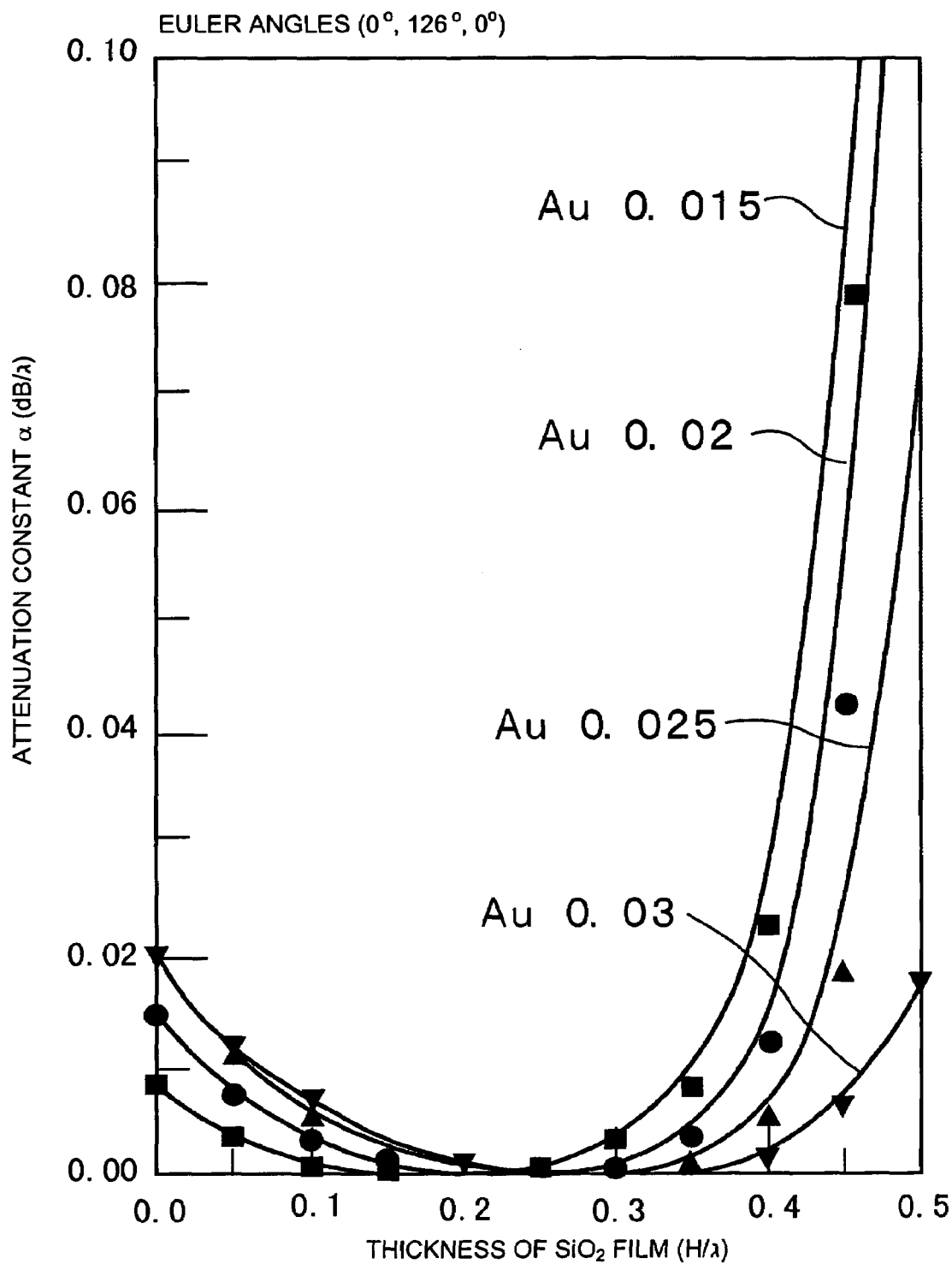
FIG. 7 is a view showing the change in attenuation constant α when IDTs composed of Au and having various thicknesses are each formed on a 38° rotation-Y plate X propagation (Euler angles (0°, 128°, 0°)) LiTaO₃ substrate, and SiO₂ films having various-normalized thicknesses are formed thereon.

In addition, the numerical analysis of the change in attenuation constant α was carried out by variously changing the film thicknesses of the IDT composed of Au and the $SiO_2$ film using two types of $LiTaO_3$ substrates having a cut angle of 36° (Euler angles (0°, 126°, 0°)) and a cut angle of 38° (Euler angles (0°, 128°, 0°)) as the rotation-Y plate X propagation $LiTaO_3$ substrate. The film thickness of Au shown in FIGS. 6 and 7 is represented by H/λ. The results are shown in FIGS. 6 and 7. As can be seen from FIGS. 6 and 7, regardless of the film thickness of the IDT composed of Au, it is understood that the attenuation constant α can be decreased when the thickness of the $SiO_2$ film is selected. That is, as can be seen from FIGS. 6 and 7, as long as the film thickness H/λ of the $SiO_2$ film is set to about 0.03 to about 0.45, and more preferably, is set in the range of from about 0.10 to about 0.35, it is understood that the attenuation constant α can be significantly decreased whenever an IDT composed of Au having any thickness is provided on either of the $LiTaO_3$ substrates having the cut angles described above.

In addition, as shown in FIG. 3, when the IDT composed of Au is used, it is understood that a sufficiently high reflection coefficient can be obtained even though the film thickness is small as compared to that composed of Al.

Accordingly, from the results shown in FIGS. 2 to 7, in the case in which the IDT composed of Au having a film thickness H/λ of about 0.013 to about 0.030 is formed on the $LiTaO_3$ substrate, when the film thickness H/λ of the $SiO_2$ film is set in the range of about 0.03 to about 0.45, in addition to a high electromechanical coefficient, a significantly small attenuation constant α can be obtained, and a sufficient reflection coefficient can be obtained.

Figure 8:
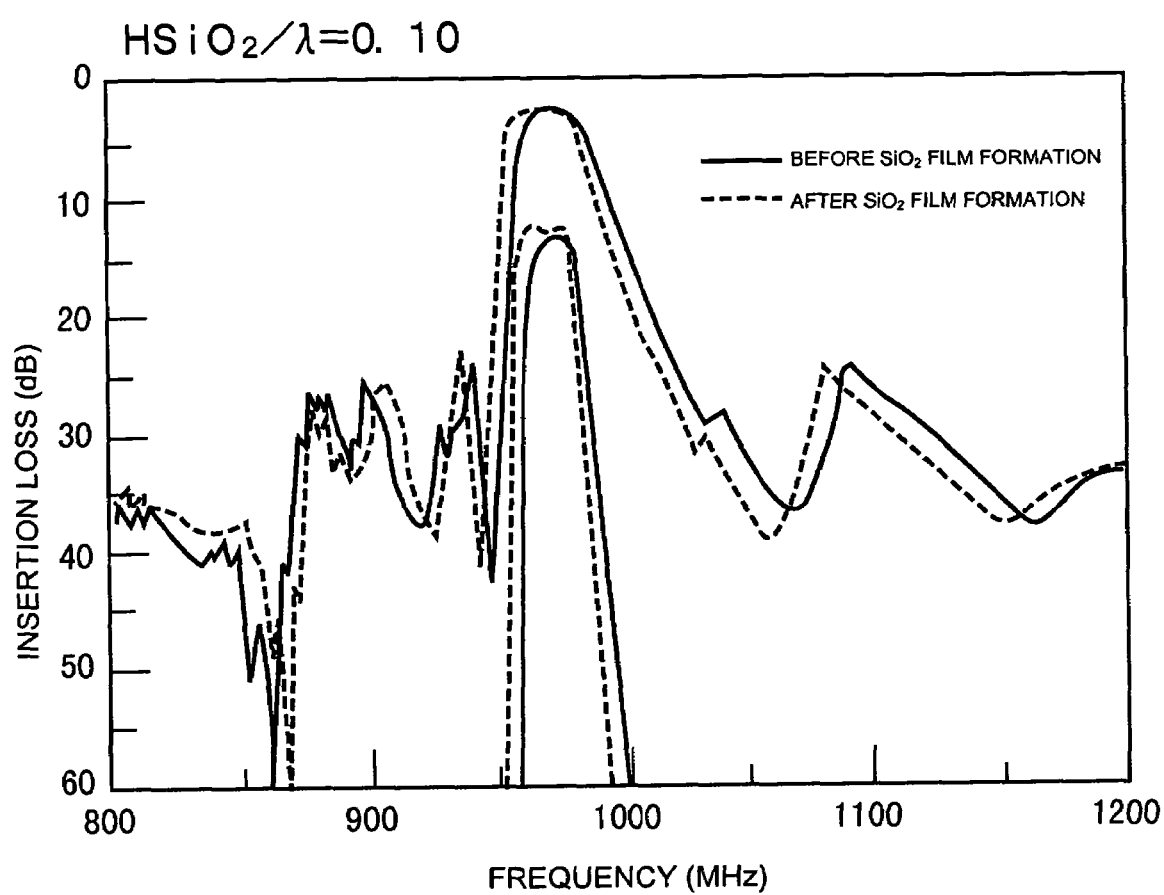
FIG. 8 is a view showing attenuation-frequency characteristics of a surface acoustic wave device according to one example and, for the sake of comparison, those of a surface acoustic wave device before a SiO$_2$ film is formed.

In the example described above, a surface acoustic wave device 11 was formed having the structure in which on a $LiTaO_3$ substrate having a cut angle of 36° (Euler angles (0°, 126°, 0°)), an IDT composed of Au having a normalized thickness H/λ of about 0.02° was formed, and a $SiO_2$ film having a normalized thickness H/λ of about 0.1 was then formed thereon, and attenuation-frequency characteristics of the surface acoustic wave device 11 are shown by dashed lines in FIG. 8. In addition, for the sake of comparison, the attenuation-frequency characteristics of this surface acoustic wave device before the $SiO_2$ film is formed are shown by the solid lines.

As can be seen in FIG. 8, it is understood that although the electromechanical coefficient is slightly decreased from about 0.30 to about 0.28 by the formation of the $SiO_2$ film, the insertion loss is improved. Accordingly, as can be seen in FIG. 8, it is confirmed that the attenuation constant $\alpha$ is decreased when the $SiO_2$ film is formed to have the specific thickness range described above.

Figure 9A:
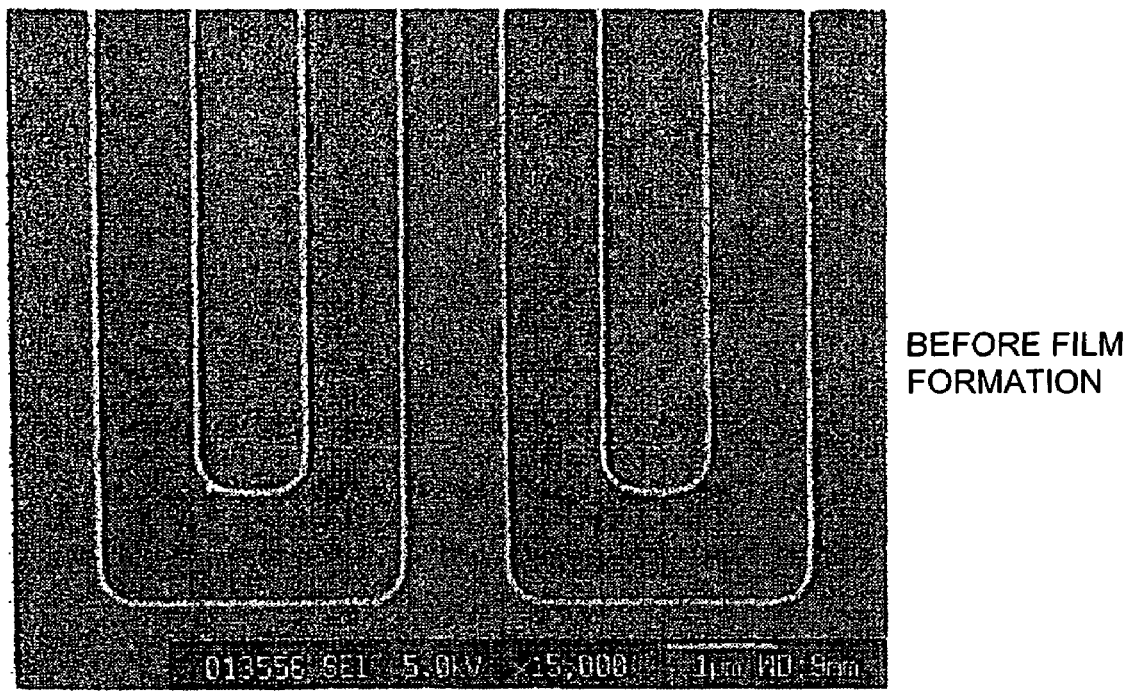
FIGS. 9(A) to 9(B) are views of scanning electron microscopic pictures showing the surface states of areas, where an IDT of a surface acoustic wave device according to one example is formed, before FIG. 9(A) and after FIG. 9(B) a SiO$_2$ film is formed thereon.
Figure 9B:
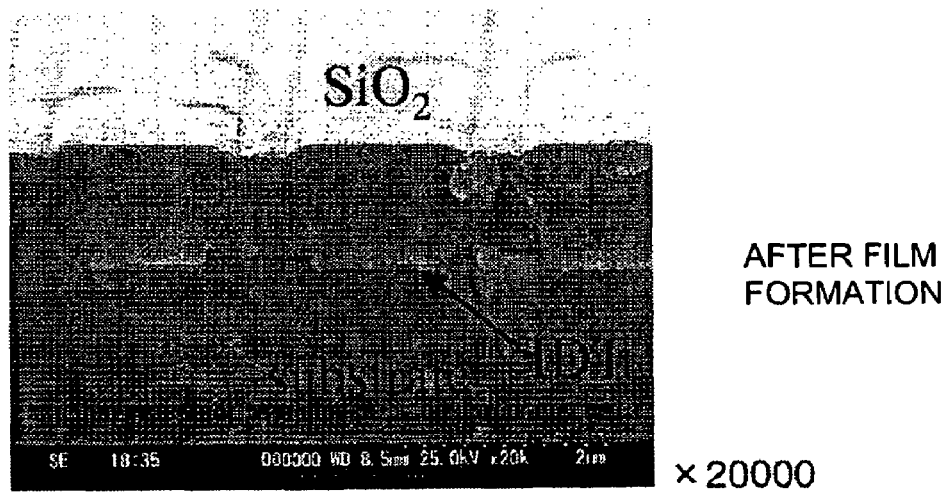

In addition, FIGS. 9(A) and 9(B) are scanning electron microscopic pictures showing the surfaces of the surface acoustic wave device according to the above-described example. In these pictures, the states before and after a $SiO_2$ film having a normalized thickness H/λ of about 0.3 is formed on an IDT composed of Au having a normalized thickness H/λ of about 0.02 are shown. As can be seen in FIG. 9(B) showing the state after the film is formed, no cracks are observed on the surface of the $SiO_2$ film, and hence it is understood that degradation of properties caused by cracks is prevented from occurring.

The inventors of the present invention formed IDTs composed of Au having a normalized thickness of about 0.02 on rotation-Y plate X propagation $LiTaO_3$ substrates having various cut angles and then further formed $SiO_2$ films having various thicknesses, thereby forming experimental one port type surface acoustic wave resonators. In the case described above, the normalized thicknesses of the $SiO_2$ film were set to approximately 0.10, 0.20, 0.30, and 0.45. The Q values of the one port type surface acoustic wave resonators thus formed were measured. The results are shown in FIG. 13.

In general, when the Q value of a resonator is increased, the steepness of filter characteristics is greatly improved from the pass band to the attenuation band when the resonator is used as a filter. Accordingly, when a filter having steep characteristics is required, a higher Q value is preferable. As can be seen in FIG. 13, it is understood that regardless of the film thickness of the $SiO_2$ film, the Q value becomes maximum at a cut angle of approximately 48° rotation-Y plate and is relatively large at a cut angle in the range of about 42° to about 58°.

Figure 13:
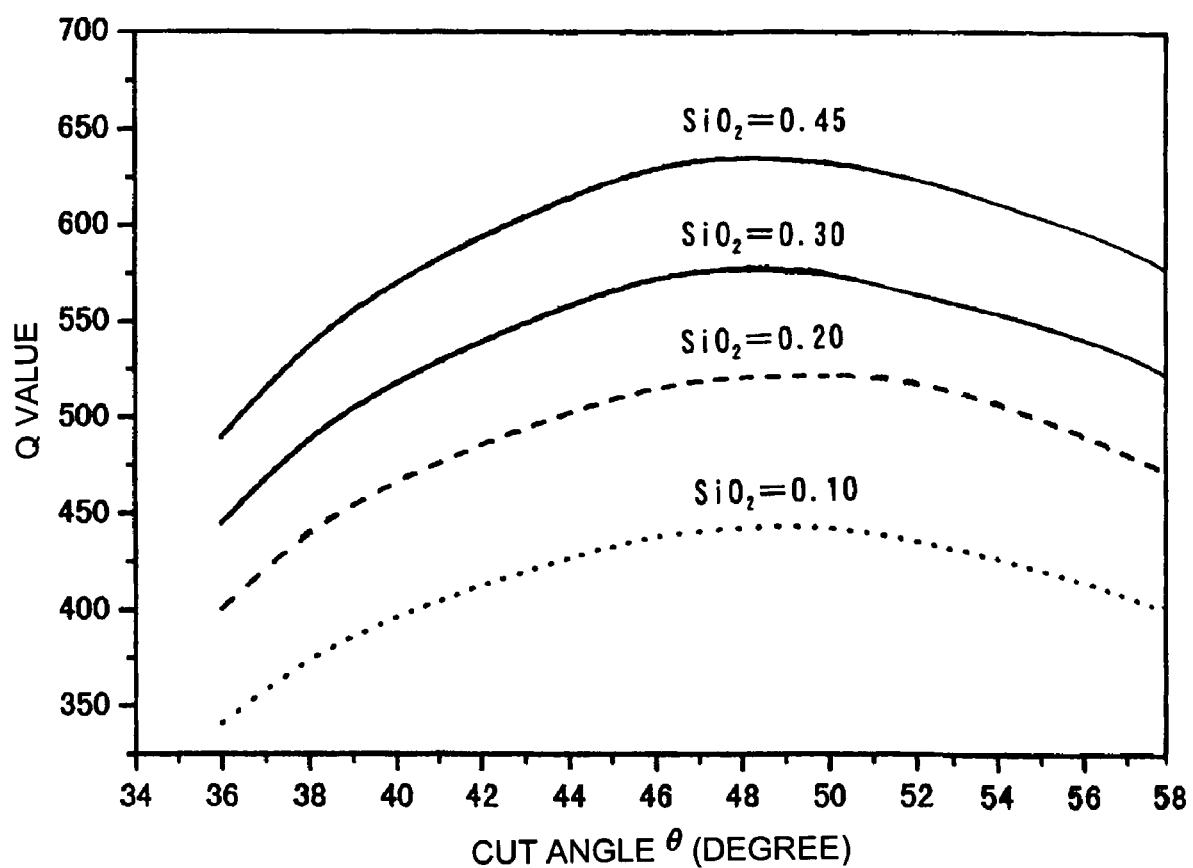
FIG. 13 is a view showing the change in Q value when a cut angle θ of a LiTaO$_3$ substrate and the normalized thickness of a SiO$_2$ film are changed.

Accordingly, as can be seen in FIG. 13, when the structure includes a $LiTaO_3$ substrate having a cut angle of about 42° to about 58° rotation-Y plate (Euler angles (0°, 132° to 148°, 0°)), and at least one IDT composed of a metal having a density higher than that of Au and a $SiO_2$ film are formed on the $LiTaO_3$ substrate so as to cover the IDT, it is understood that a high Q value can be obtained. As can be seen in FIG. 13, the cut angle is preferably about 46.5° to about 53° rotation-Y plate (Euler angles (0°, 136.5° to 143°, 0°)).

Figure 14A:
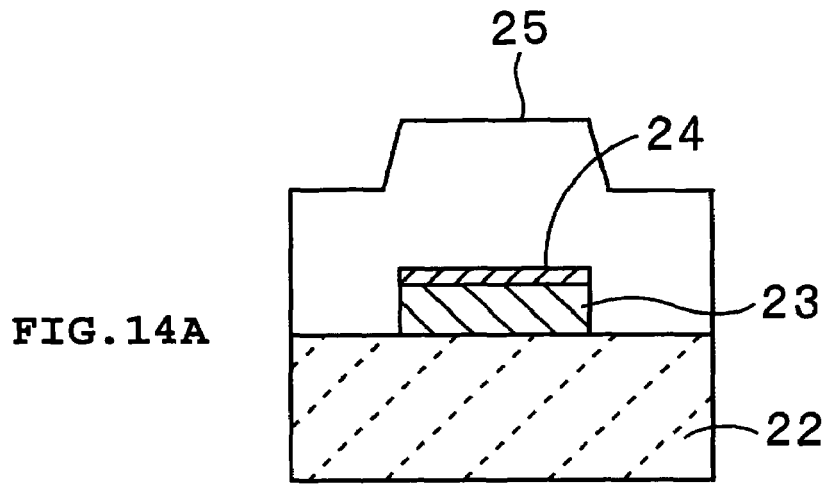
FIGS. 14(A) to 14(C) are schematic cross-sectional views for illustrating surface acoustic wave devices each provided with an adhesive layer according to modified examples of the present invention.

In preferred embodiments of the present invention, an adhesive layer may be provided on the upper surface of the IDT. That is, as shown in FIG. 14(A), on a $LiTaO_3$ substrate 22, an IDT 23 is formed, and on the upper surface of the IDT 23, an adhesive layer 24 may be formed. The adhesive layer 24 is disposed between the IDT 23 and a $SiO_2$ film 25. The adhesive layer 24 is provided to increase an adhesive strength of the $SiO_2$ film 25 to the IDT 23. As a material for forming the adhesive layer 24 described above, Pd, Al, or an alloy thereof is preferably used. In addition, besides the metals, a piezoelectric material such as ZnO or another ceramic such as $Ta_2O_3$ or $Al_2O_3$ may be used for forming the adhesive layer 24. By the formation of the adhesive layer 24, the adhesive strength between the IDT 23 formed of a metal having a density higher than that of Al and the $SiO_2$ film 25 is increased, and hence peeling of the $SiO_2$ film is reliably prevented.

Figure 14B:
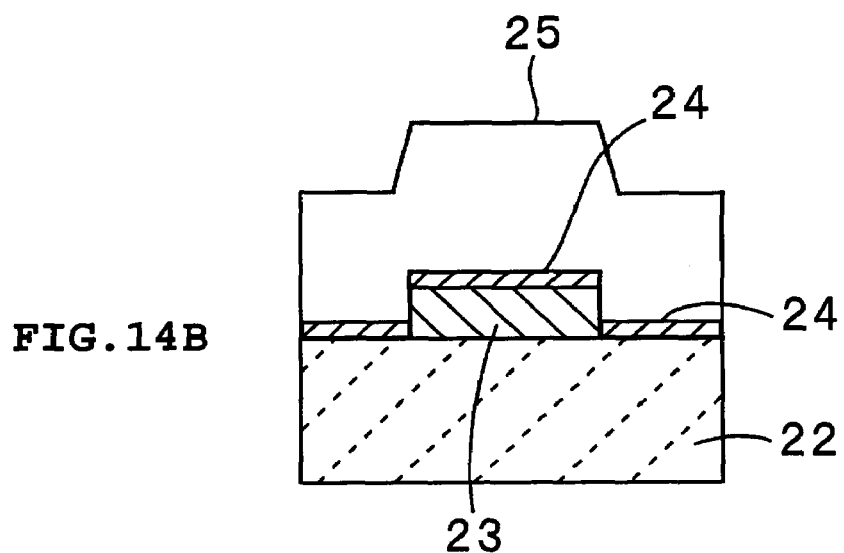
Figure 14C:
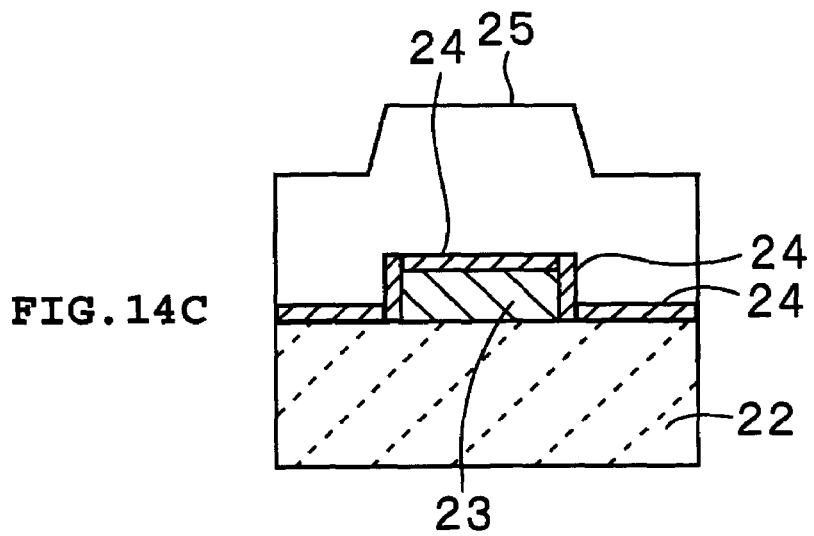
Figure 15:
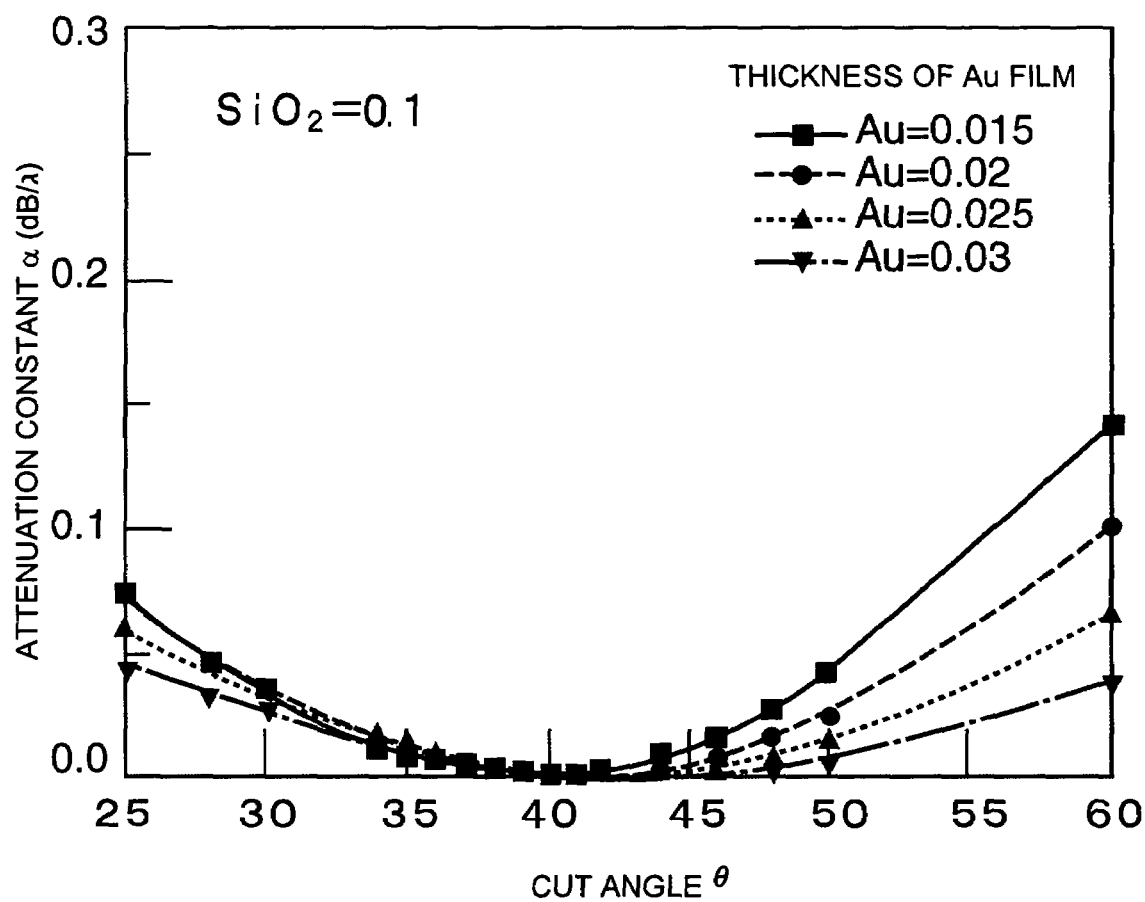
FIG. 15 is a view showing the relationship between θ and the attenuation constant α of various Au electrode thicknesses when a SiO$_2$ film has a thickness H/λ of about 0.1.
Figure 16:
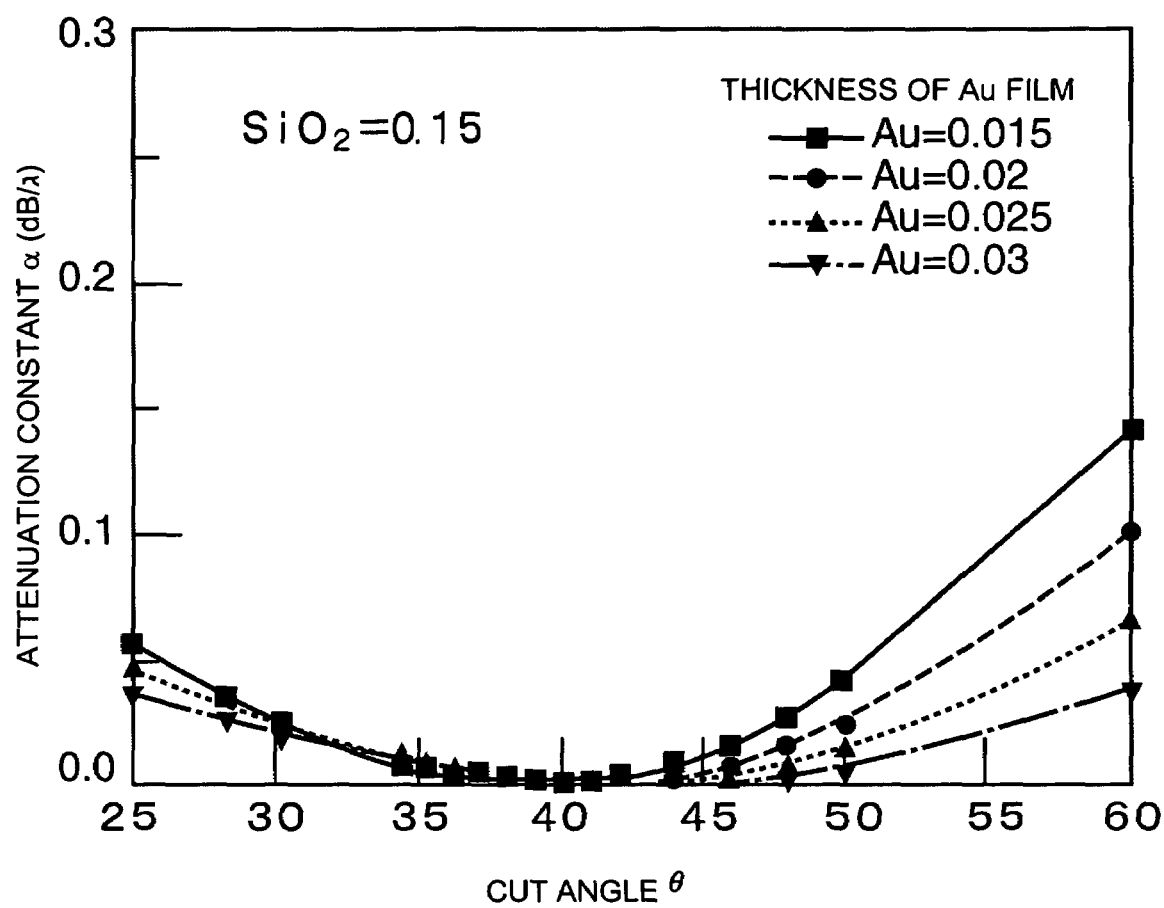
FIG. 16 is a view showing the relationship between θ and the attenuation constant α of various Au electrode thicknesses when a SiO$_2$ film has a thickness H/λ of about 0.15.
Figure 17:
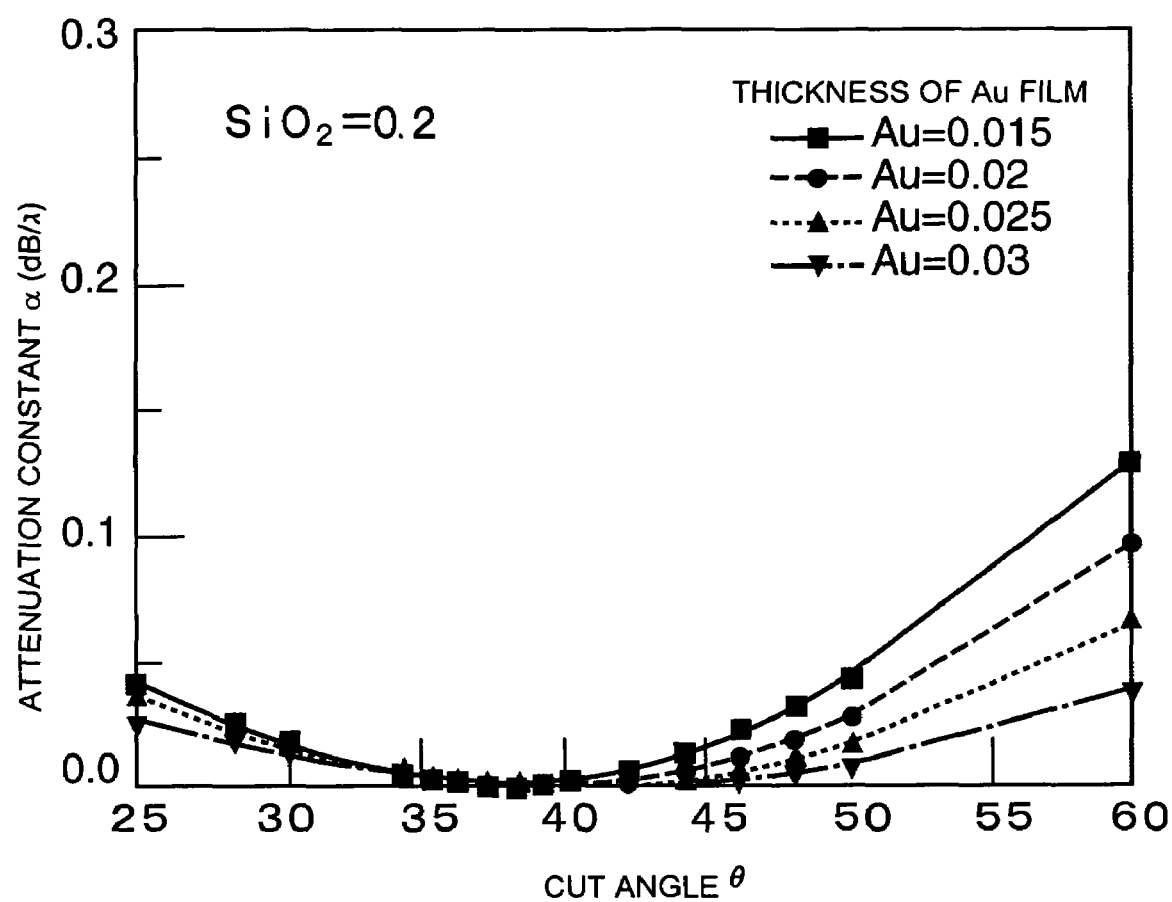
FIG. 17 is a view showing the relationship between θ and the attenuation constant α of various Au electrode thicknesses when a SiO$_2$ film has a thickness H/λ of about 0.2.
Figure 18:
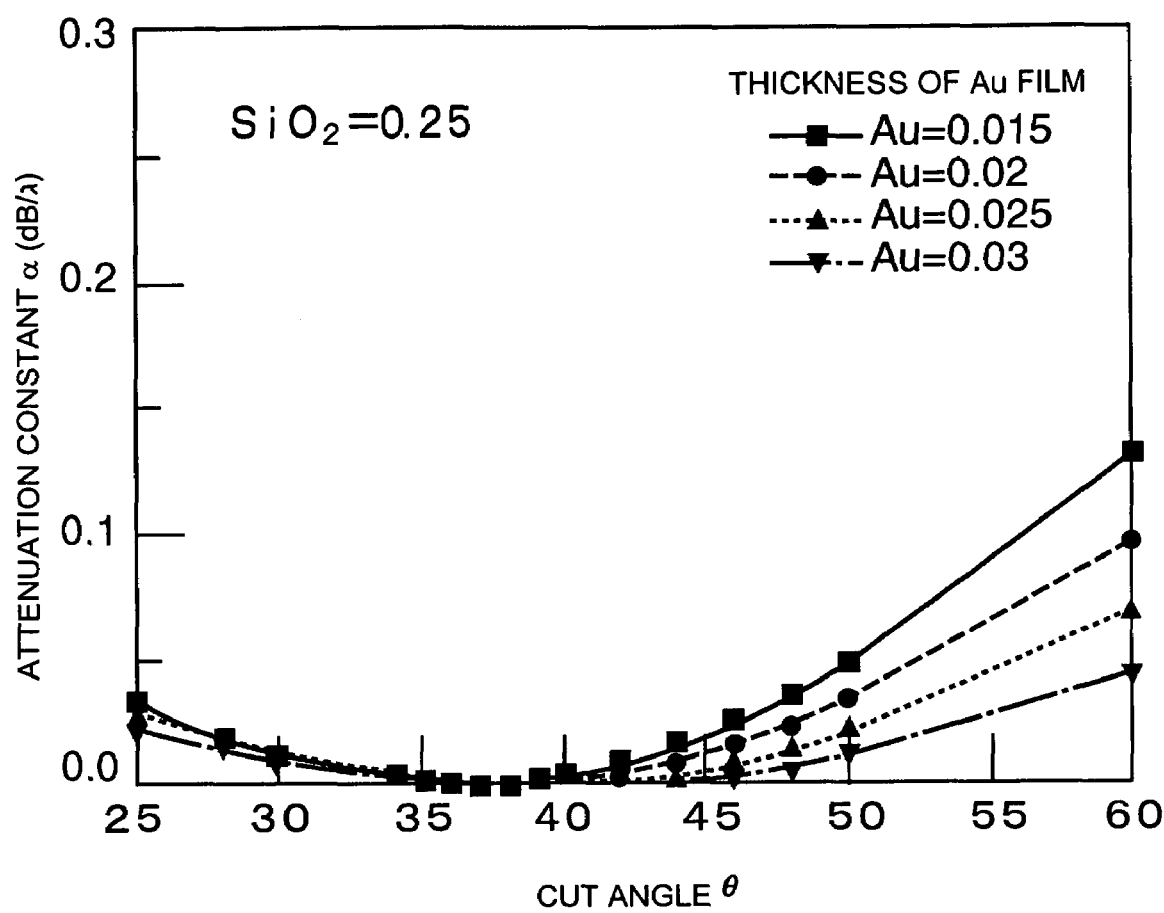
FIG. 18 is a view showing the relationship between θ and the attenuation constant α of various Au electrode thicknesses when a SiO$_2$ film has a thickness H/λ of about 0.25.
Figure 19:
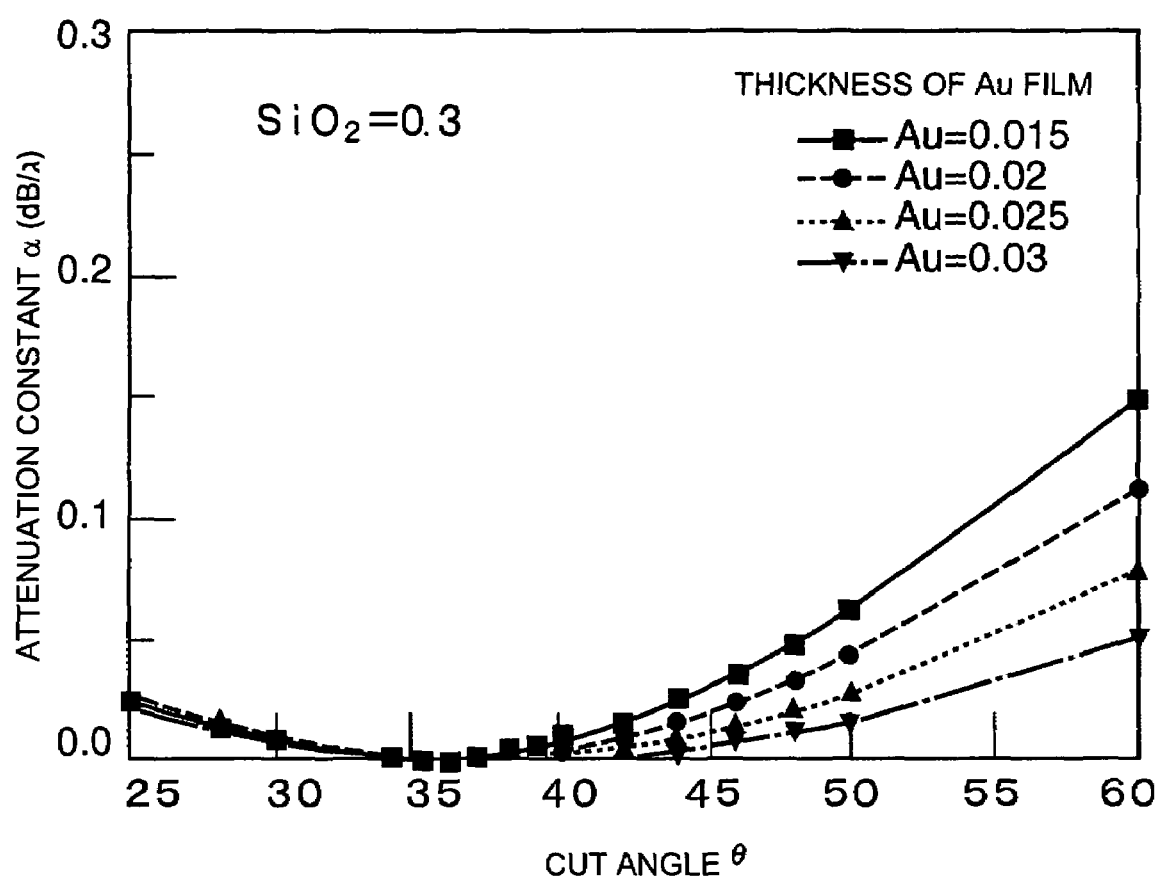
FIG. 19 is a view showing the relationship between θ and the attenuation constant α of various Au electrode thicknesses when a SiO$_2$ film has a thickness H/λ of about 0.3.
Figure 20:
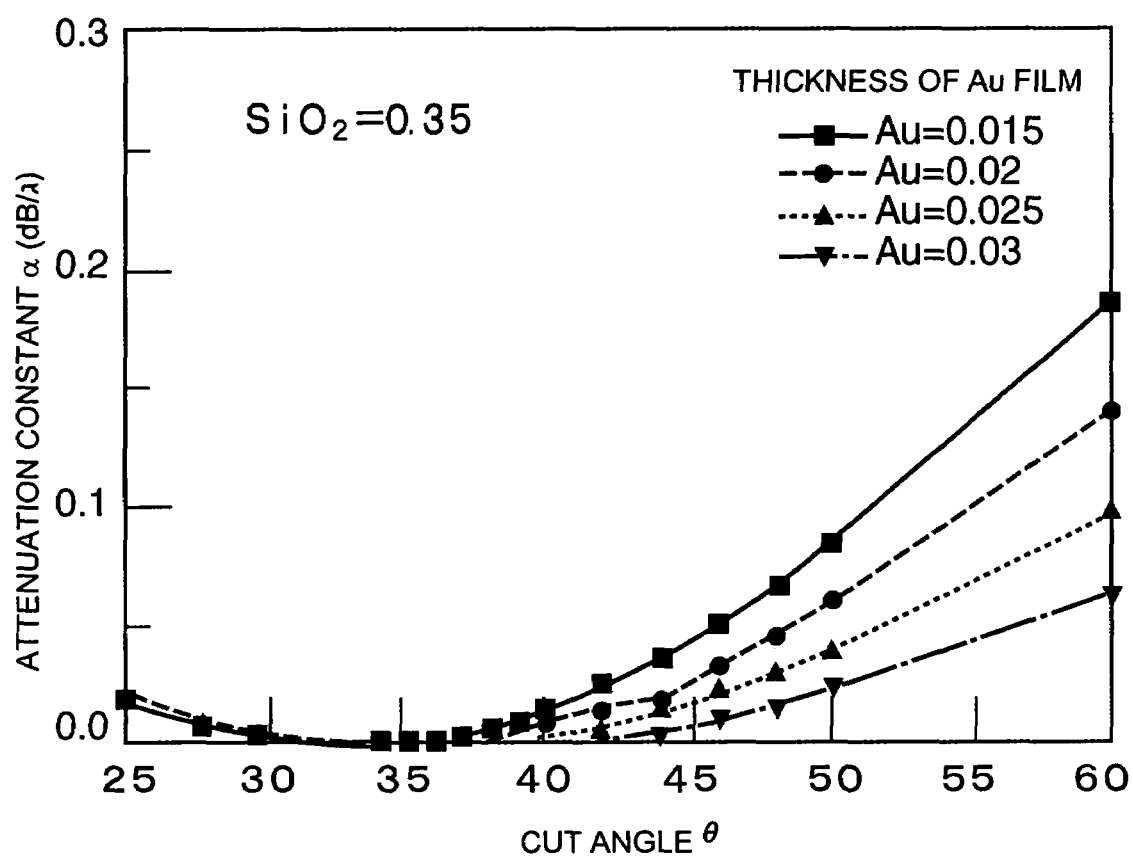
FIG. 20 is a view showing the relationship between θ and the attenuation constant α of various Au electrode thicknesses when a SiO$_2$ film has a thickness H/λ of about 0.35.
Figure 21:
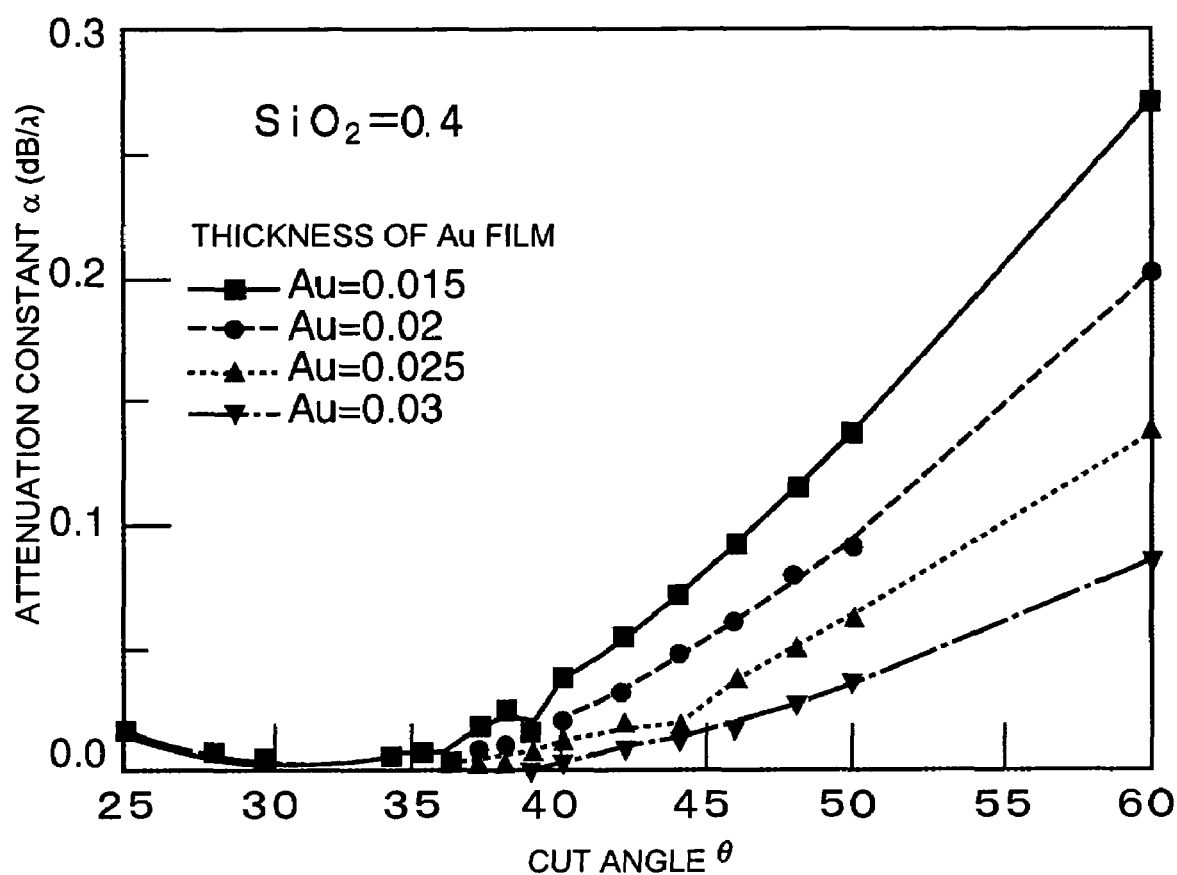
FIG. 21 is a view showing the relationship between θ and the attenuation constant α of various Au electrode thicknesses when a SiO$_2$ film has a thickness H/λ of about 0.4.
Figure 22:
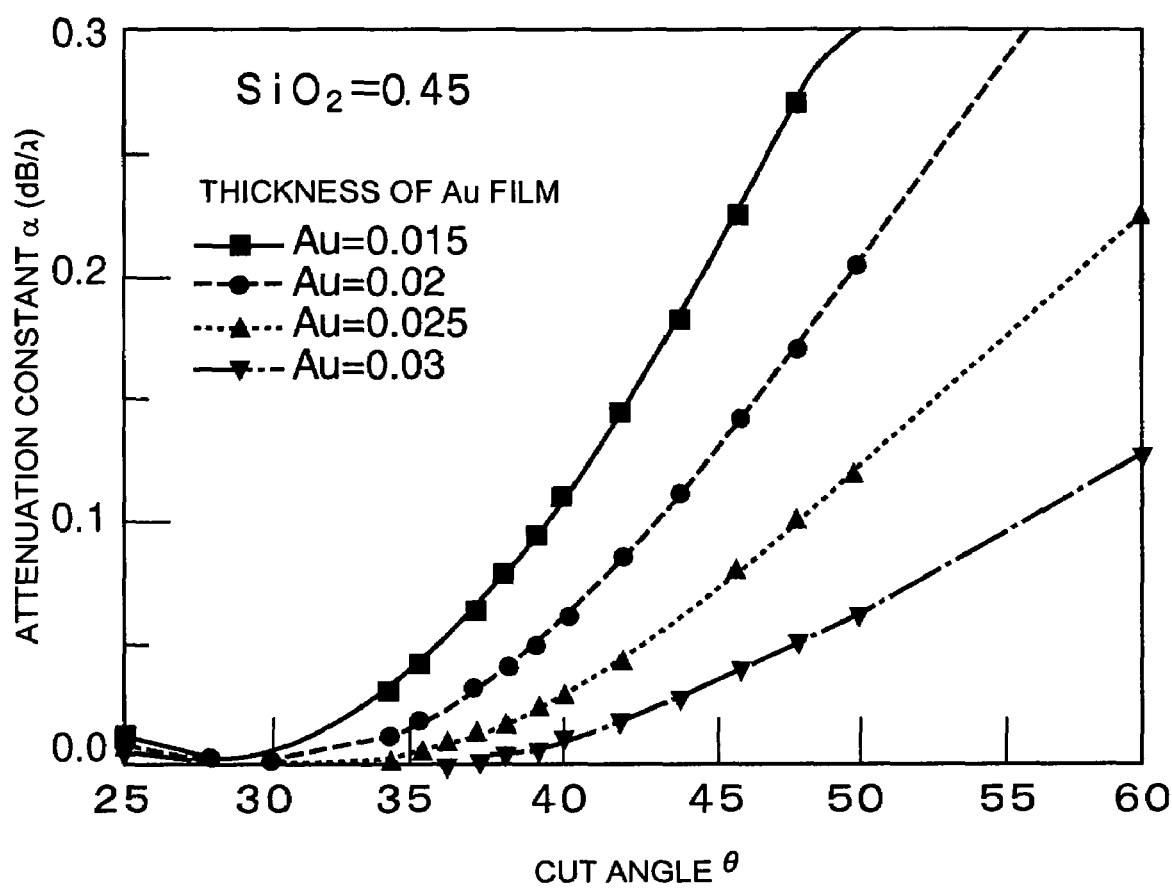
FIG. 22 is a view showing the relationship between θ and the attenuation constant α of various Au electrode thicknesses when a SiO$_2$ film has a thickness H/λ of about 0.45.

The thickness of the adhesive layer 24 is preferably set to approximately one percent of the wavelength of the surface acoustic wave so as not to influence the entirety of the surface acoustic wave. In addition, in FIG. 14(A), the adhesive layer 24 is formed on the upper surface of the IDT 23. However, as shown in FIG. 14(B), an adhesive layer 24A may be formed at the interface of the $SiO_2$ film 25 on the $LiTaO_3$ substrate. Furthermore, as shown in FIG. 14(C), the adhesive layer 24 may be formed on side surfaces of the IDT 23 in addition to the upper surface thereof.

In addition, as another structure for improving the adhesive strength of the $SiO_2$ film, a plurality of electrodes including electrode pads used for electrode connection with a bus bar and the outside, other than the IDT, may be formed of an underlying metal layer composed of the same material as that for the IDT and an upper metal layer which is provided on the underlying metal layer and is composed of Al or an Al alloy. That is, for example, as electrode films forming the reflectors 14a and 14b shown in FIG. 1, a film may be formed containing an Al film provided on an underlying metal layer composed of the same material as that for the IDTs 13a and 13b. As described above, by providing the upper metal layer composed of Al or an Al alloy, the adhesion strength to the $SiO_2$ film is greatly increased. In addition, the electrode cost can be reduced, and an Al wedge-bonding property can also be improved.

As the electrodes other than the IDT, in addition to the pads used for electrode connection with the bus bar and the outside, lead electrodes provided whenever necessary may also be mentioned. In addition, the Al alloy is not specifically limited. However, an Al—Ti alloy or Al—Ni—Cr alloy may be mentioned by way of example.

In the case in which a rotation-Y plate X propagation $LiTaO_3$ substrate having a cut angle different from that described in the above example, when an IDT composed of Au is formed, it was also confirmed by the inventors of preferred embodiments of the present invention that the attenuation constant $\alpha$ can be minimized by a $SiO_2$ film having a specific film thickness. That is, when the film thickness of the $SiO_2$ film is set in a specific range, as in the case of the above example, the attenuation constant $\alpha$ can be decreased. In addition, the relationship between the cut angles and $\alpha$ is shown in FIGS. 15 to 22 when the film thickness H/λ of the $SiO_2$ film is set in the range of about 0.1 to about 0.45. From these figures, it was found that, with increase in $SiO_2$ film thickness, the cut angle at which $\alpha$ is minimized becomes smaller. Accordingly, even when a rotation-Y plate X propagation $LiTaO_3$ substrate having a cut angle different from that mentioned above is used, as long as an IDT composed of Au is formed, a $SiO_2$ film is provided thereon, and the film thickness of the $SiO_2$ film is selected, a surface acoustic wave device can be formed having a high electromechanical coefficient, a high reflection coefficient, and a superior frequency-temperature characteristic TCF, which is approximately less than half compared to a conventional surface acoustic wave device. It was confirmed that preferable combinations of the cut angle of the $LiTaO_3$ substrate, the electrode thickness of the IDT composed of Au, and the film thickness of the $SiO_2$ film, which can realize the effects described above, are represented by the following combinations from (a) to (k) and (m) to (r). However, due to the variation in metallization ratio, material constant, and other factors, it has been considered that the rotation cut angle may be deviated by approximately ±4° from the value described above.

TABLE 5

|     | Cut Angle θ | Thickness of Au | Thickness of SiO$_2$ |
| --- | --- | --- | --- |
| (a) | 30.0° ≦ θ < 33.0° | 0.013 to 0.018 | 0.15 to 0.45 |
| (b) | 33.0° ≦ θ < 34.5° | 0.013 to 0.022 | 0.10 to 0.40 |
| (c) | 34.5° ≦ θ < 35.5° | 0.013 to 0.025 | 0.07 to 0.40 |
| (d) | 35.5° ≦ θ < 37.5° | 0.013 to 0.025 | 0.06 to 0.40 |
| (e) | 37.5° ≦ θ < 39.0° | 0.013 to 0.028 | 0.04 to 0.40 |
| (f) | 39.0° ≦ θ < 40.0° | 0.017 to 0.030 | 0.03 to 0.42 |
|     | → preferably | 0.022 to 0.028 | 0.04 to 0.40 |
| (g) | 40.0° ≦ θ < 41.5° | 0.017 to 0.030 | 0.03 to 0.42 |
|     | → preferably | 0.022 to 0.028 | 0.04 to 0.40 |
| (h) | 41.5° ≦ θ < 43.0° | 0.018 to 0.028 | 0.05 to 0.33 |
| (i) | 43.0° ≦ θ < 45.0° | 0.018 to 0.030 | 0.05 to 0.30 |
| (j) | 45.0° ≦ θ ≦ 47.0° | 0.019 to 0.032 | 0.05 to 0.25 |
| (k) | 47.0° ≦ θ ≦ 50.0° | 0.019 to 0.032 | 0.05 to 0.25 |

TABLE 6

|     | Cut Angle θ | Thickness of Au | Thickness of SiO$_2$ |
| --- | --- | --- | --- |
| (m) | 39.0° ≦ θ < 40.0° | 0.022 to 0.028 | 0.04 to 0.40 |
| (n) | 40.0° ≦ θ < 41.5° | 0.022 to 0.028 | 0.04 to 0.40 |
| (o) | 41.5° ≦ θ < 43.0° | 0.022 to 0.028 | 0.05 to 0.33 |
| (p) | 43.0° ≦ θ < 45.0° | 0.022 to 0.030 | 0.05 to 0.30 |
| (q) | 45.0° ≦ θ < 47.0° | 0.022 to 0.032 | 0.05 to 0.25 |
| (r) | 47.0° ≦ θ ≦ 50.0° | 0.022 to 0.032 | 0.05 to 0.25 |

Figure 23:
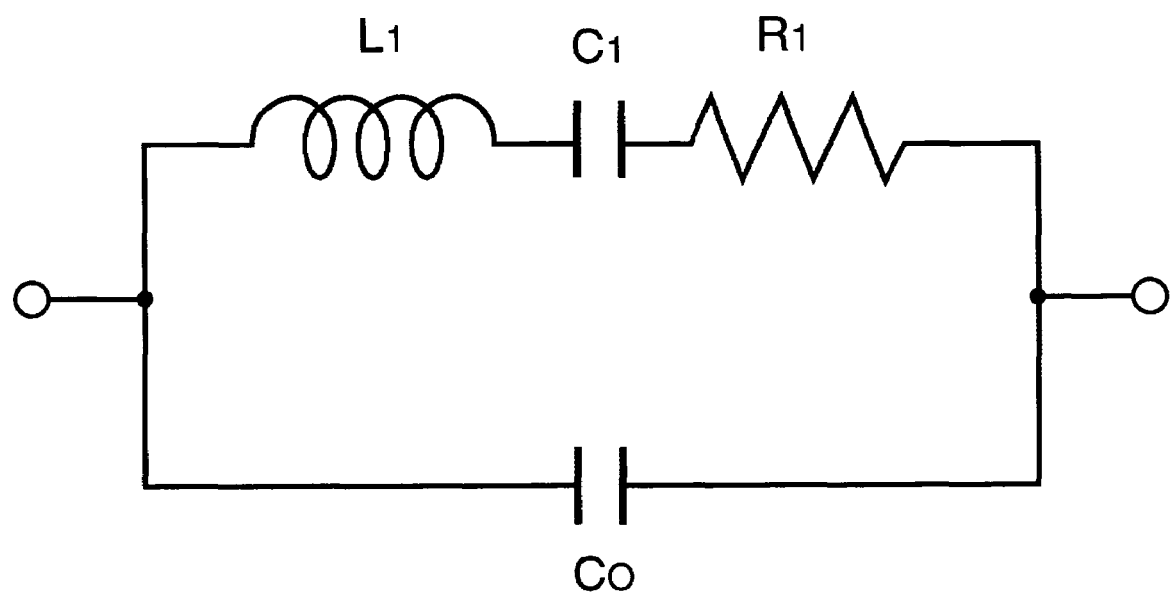
FIG. 23 is a view showing an equivalent circuit of a surface acoustic wave resonator according to one example of preferred embodiments of the present invention.
Figure 24:
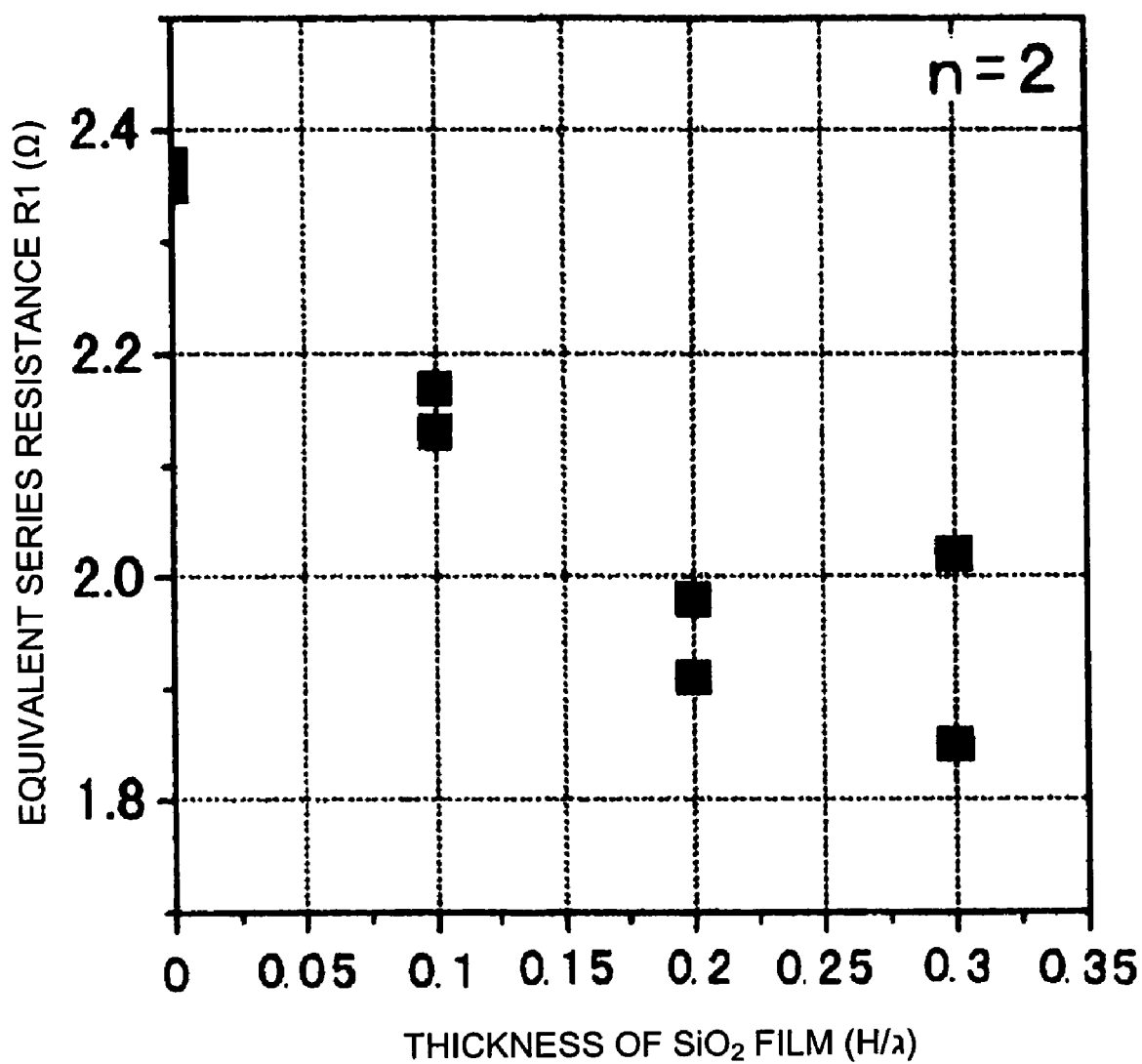
FIG. 24 is a view showing the relationship between the normalized thickness of a SiO$_2$ film in a surface acoustic wave resonator according to preferred embodiments of the present invention and the equivalent series resistance when the surface acoustic wave resonator is fitted in a resonant circuit.
Figure 25A:
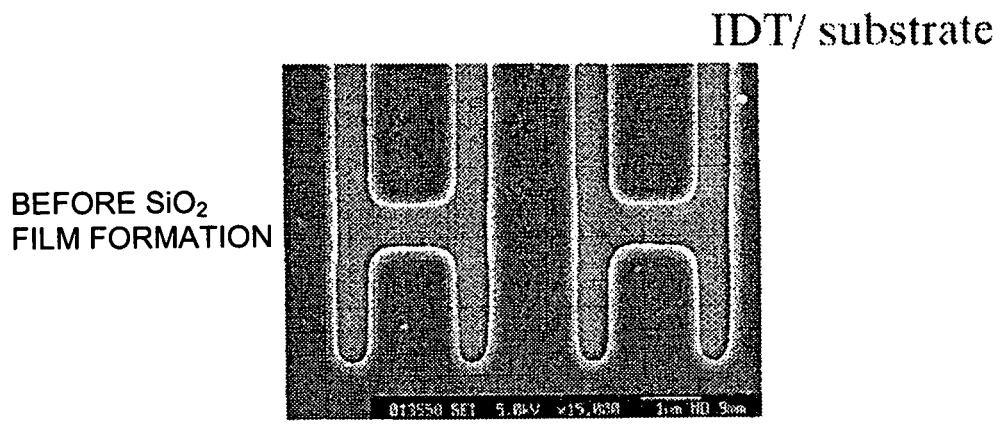
FIGS. 25(A) to 25(C) are scanning electron microscopic pictures for illustrating problems of a conventional surface acoustic wave device.
Figure 25B:
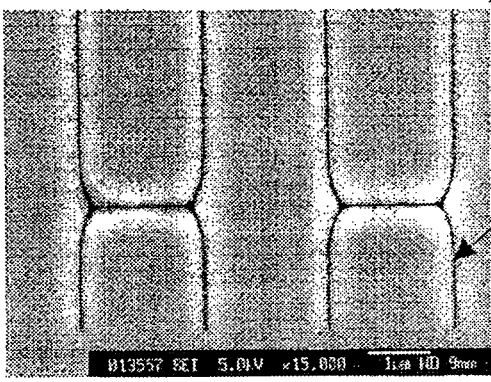
Figure 25C:
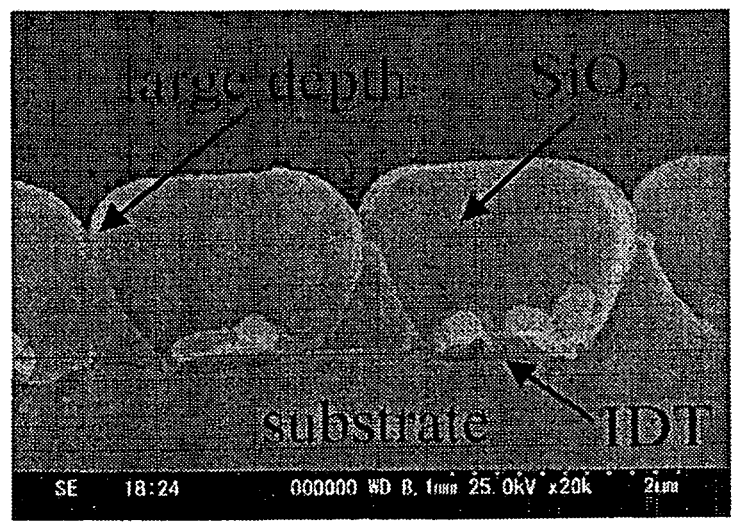

FIG. 24 shows equivalent series resistances R1 of resonant circuits shown in FIG. 23 fitted with surface acoustic wave resonators of 900 MHz band, which are produced by forming IDTs each composed of Au and having a normalized thickness of about 0.02 on a 36° rotation-Y plate X propagation (Euler angles (0°, 126°, 0°)) LiTaO$_3$ substrate, and forming SiO$_2$ films having various thicknesses thereon. Related to this, the equivalent series resistance R1 of the resonant circuit fitted with the surface acoustic wave resonator represents approximately loss caused by electrode resistance and loss caused by attenuation of the surface acoustic wave. Accordingly, when the resistance of the electrode is approximately constant, the tendency of R1 approximately coincides with that of α (attenuation constant).

As can be seen in FIG. 24, compared to the case in which the SiO$_2$ film is not provided, it is found that when the SiO$_2$ film is formed, R1 is decreased, and when the normalized thickness of the SiO$_2$ film is about 0.02 or more, the equivalent series resistance R1 is decreased. This coincides with the tendency shown in FIG. 6.

Figure 10:
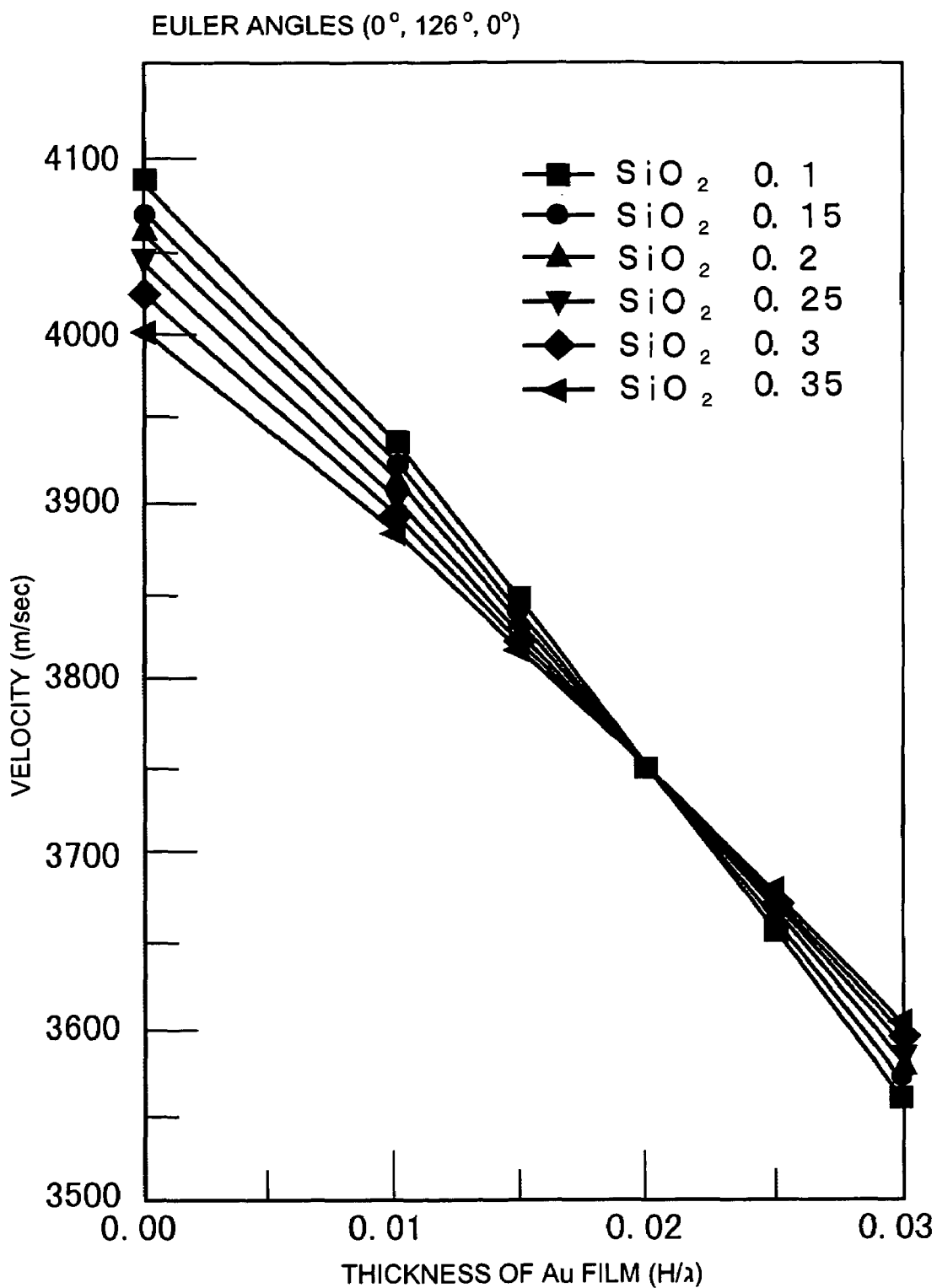
FIG. 10 is a view showing the change in acoustic velocity of a leakage surface acoustic wave when the normalized thickness of an IDT composed of Au is variously changed in the structure in which the IDT composed of Au is formed on a 36° rotation-Y plate X propagation (Euler angles (0°, 126°, 0°)) LiTaO$_3$ substrate, and SiO$_2$ films having various thicknesses are formed thereon.
Figure 11:
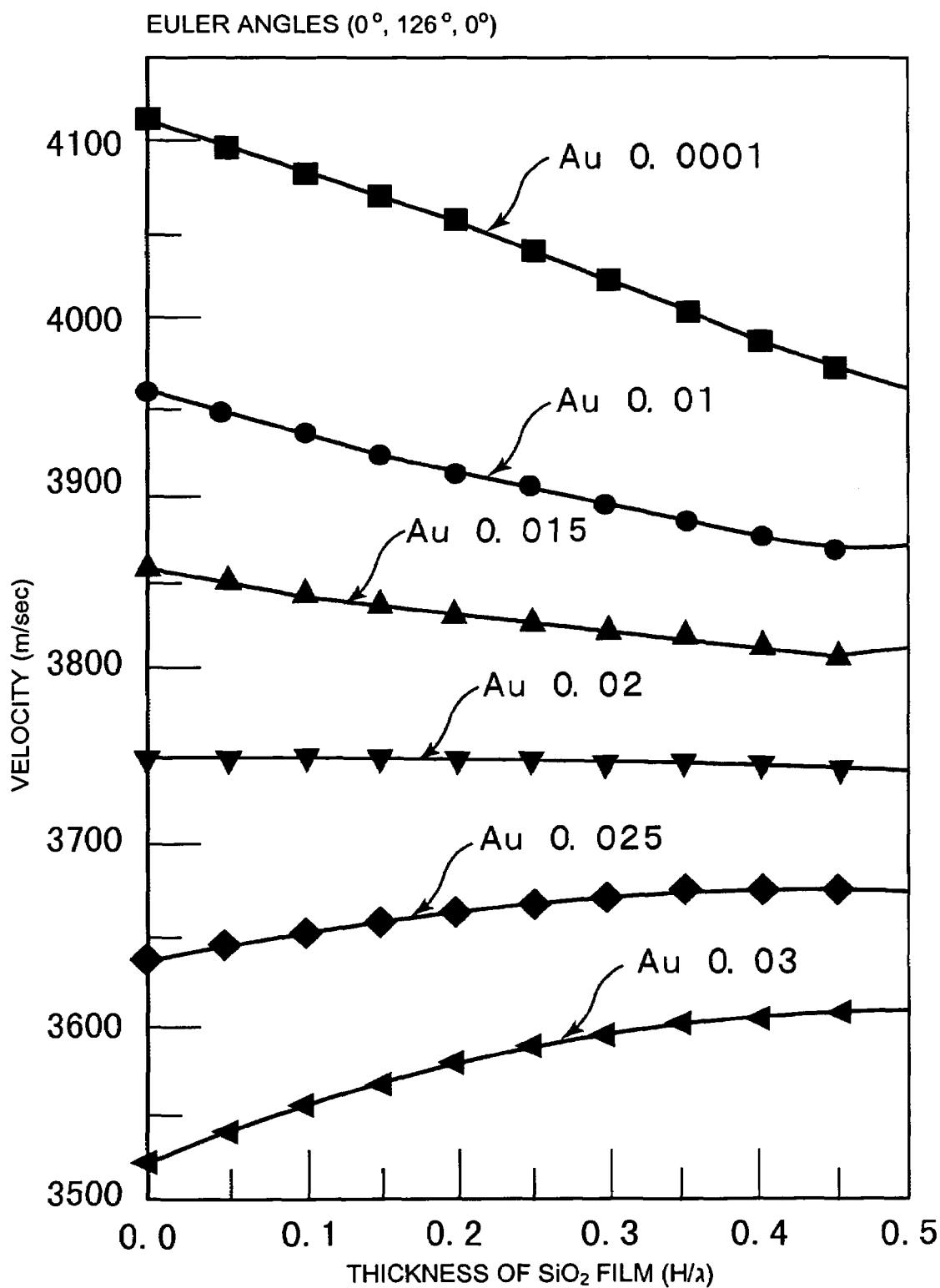
FIG. 11 is a view showing the change in acoustic velocity of a leakage surface acoustic wave when the normalized thickness of a SiO$_2$ film is variously changed in the structure in which IDTs composed of Au having various normalized thicknesses are each formed on a 36° rotation-Y plate X propagation (Euler angles (0°, 126°, 0°)) LiTaO$_3$ substrate, and the SiO$_2$ film is formed thereon.

When the surface acoustic wave device of preferred embodiments of the present invention is manufactured, it is preferable that frequency adjustment be performed in the state in which an IDT primarily composed of Au is formed on a rotation-Y plate X propagation LiTaO$_3$ substrate, and that a SiO$_2$ film be then formed having a thickness in the range in which the attenuation constant α can be decreased. These steps will be described with reference to FIGS. 10 and 11. FIG. 10 shows the change in acoustic velocity of a leakage surface acoustic wave in the case in which IDTs composed of Au having various thicknesses and SiO$_2$ films provided thereon and having various thicknesses are formed on a 36° rotation-Y plate X propagation (Euler angles (0°, 126°, 0°)) LiTaO$_3$ substrate. In addition, FIG. 11 shows the change in acoustic velocity of a leakage surface acoustic wave in the case in which IDTs composed of Au having various thicknesses are formed on a LiTaO$_3$ substrate having the same Euler angles as described above, and SiO$_2$ films having various normalized thicknesses are formed on the IDTs. As it is clearly understood when FIGS. 10 and 11 are compared to each other that the change in acoustic velocity of the surface acoustic wave is significantly large when the thickness of Au is changed as compared to the case in which the thickness of the SiO$_2$ film is changed. Accordingly, prior to the formation of the SiO$_2$ film, frequency adjustment is preferably performed, and after the IDT composed of Au is formed, for example, by laser etching or ion etching, frequency adjustment is preferably performed. When the normalized thickness of Au is in the range of from about 0.015 to about 0.03, it is particularly preferable since the change in acoustic velocity caused by the SiO$_2$ film is decreased, and hence variation in frequency caused by variation of the SiO$_2$ film can be decreased.

In the experimental examples described above, as a metal forming the IDT, Au is described by way of example. However, it has been confirmed by the inventors of the present invention that when Pt, W, Ta, Ag, Mo, Cu, Ni, Co, Cr, Fe, Mn, Zn, or Ti is used, and the thickness of the SiO$_2$ film is selected as described above, the electromechanical coefficient and reflection coefficient are significantly increased, the frequency-temperature characteristic is improved, and cracking of the SiO$_2$ film can be prevented.

In addition, in order to improve adhesion strength of the electrodes, a very thin Ti or Cr film may be formed under the Au or Ag electrodes.

In addition to the longitudinally coupled resonator type surface acoustic wave filter shown in FIG. 1, the present invention can be applied to various surface acoustic wave devices, such as surface acoustic wave resonators, laterally coupled type surface acoustic wave filters, ladder-type filters, and lattice-type filters.

In the surface acoustic wave device of various preferred embodiments of the present invention, at least one IDT composed of a metal having a density higher than that of Al is formed on a 25° to 55° rotation-Y plate X propagation LiTaO$_3$ substrate, and a SiO$_2$ film is formed so as to cover the IDT. Accordingly, the frequency-temperature characteristic can be improved by the formation of the SiO$_2$ film. In addition, compared to the case in which Al is used, the electrode thickness of the IDT can be decreased, the generation of cracks in the SiO$_2$ film can be prevented, and target properties can be reliably obtained. Furthermore, when the IDT is composed of a metal having a density higher than that of Al, the attenuation constant α may be degraded in some cases. However, by the formation of the SiO$_2$ film, the degradation of the attenuation constant α is reliably prevented.

Hence, according to preferred embodiments of the present invention, in addition to the improvement in frequency-temperature characteristic performed by the SiO$_2$ film, the generation of cracks in the SiO$_2$ film can also be prevented, and as a result, desired properties can be reliably obtained.

In addition, according to the method for manufacturing a surface acoustic wave device of preferred embodiments of the present invention, the surface acoustic wave device of preferred embodiments of the present invention can be formed having a superior frequency-temperature characteristic as described above, in which the generation of cracks in the SiO$_2$ film is prevented, and desired properties can be reliably obtained. In addition to these advantages described above, since frequency adjustment is performed after the formation of the IDT, and the SiO$_2$ film is formed after the frequency adjustment, the frequency adjustment can be more precisely performed, and hence the effects of frequency variation caused by the variation in thickness of the SiO$_2$ film are minimized. Consequently, a surface acoustic wave device having desired frequency characteristics can be reliably provided.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A surface acoustic wave device comprising:
    a 25° to 55° rotation-Y plate LiTaO$_3$ substrate having Euler angles of (0°, 115° to 145°, 0°);
    at least one IDT disposed on the LiTaO$_3$ substrate and made of a metal having a density higher than that of Al; and
    an SiO$_2$ film arranged on the LiTaO$_3$ substrate so as to cover the at least one IDT; wherein
    the at least one IDT primarily includes at least one metal selected from the group consisting of Au, Pt, W, Ta, Ag, Mo, Cu, Ni, Co, Cr, Fe, Mn, Zn, and Ti; and
    the SiO$_2$ film has a thickness normalized by the wavelength of the surface acoustic wave in the range of about 0.03 to about 0.45.

2. A surface acoustic wave device according to claim 1, wherein the IDT is made of Au and has a thickness normalized by the wavelength of a surface acoustic wave in the range of about 0.013 to about 0.030.

3. A surface acoustic wave device according to claim 1, wherein the IDT is made of one of Au and an Au alloy, and the cut angle of the LiTaO$_3$ substrate, the normalized electrode thickness of the IDT, and the normalized thickness of SiO$_2$ are shown by one of the following combinations (a) to (k):

|     | Cut Angle θ | Thickness of Au | Thickness of SiO$_2$ |
|-----|-------------|-----------------|----------------------|
| (a) | 30.0° ≦ θ < 33.0° | 0.013 to 0.018 | 0.15 to 0.45 |
| (b) | 33.0° ≦ θ < 34.5° | 0.013 to 0.022 | 0.10 to 0.40 |
| (c) | 34.5° ≦ θ < 35.5° | 0.013 to 0.025 | 0.07 to 0.40 |
| (d) | 35.5° ≦ θ < 37.5° | 0.013 to 0.025 | 0.06 to 0.40 |
| (e) | 37.5° ≦ θ < 39.0° | 0.013 to 0.028 | 0.04 to 0.40 |
| (f) | 39.0° ≦ θ < 40.0° | 0.017 to 0.030 | 0.03 to 0.42 |
| (g) | 40.0° ≦ θ < 41.5° | 0.017 to 0.030 | 0.03 to 0.42 |
| (h) | 41.5° ≦ θ < 43.0° | 0.018 to 0.028 | 0.05 to 0.33 |
| (i) | 43.0° ≦ θ < 45.0° | 0.018 to 0.030 | 0.05 to 0.30 |
| (j) | 45.0° ≦ θ ≦ 47.0° | 0.019 to 0.032 | 0.05 to 0.25 |
| (k) | 47.0° ≦ θ ≦ 50.0° | 0.019 to 0.032 | 0.05 to 0.25. |

4. A surface acoustic wave device according to claim 1, wherein the IDT is made of one of Au and an Au alloy, and the cut angle of the LiTaO$_3$ substrate, the normalized electrode thickness of the IDT, and the normalized thickness of SiO$_2$ are shown by one of the following combinations (m) to (r):

|     | Cut Angle θ | Thickness of Au | Thickness of SiO$_2$ |
|-----|-------------|-----------------|----------------------|
| (m) | 39.0° ≦ θ < 40.0° | 0.022 to 0.028 | 0.04 to 0.40 |
| (n) | 40.0° ≦ θ < 41.5° | 0.022 to 0.028 | 0.04 to 0.40 |
| (o) | 41.5° ≦ θ < 43.0° | 0.022 to 0.028 | 0.05 to 0.33 |
| (p) | 43.0° ≦ θ < 45.0° | 0.022 to 0.030 | 0.05 to 0.30 |

-continued

|     | Cut Angle θ | Thickness of Au | Thickness of SiO$_2$ |
|-----|-------------|-----------------|----------------------|
| (q) | 45.0° ≦ θ < 47.0° | 0.022 to 0.032 | 0.05 to 0.25 |
| (r) | 47.0° ≦ θ ≦ 50.0° | 0.022 to 0.032 | 0.05 to 0.25. |

5. A surface acoustic wave device according to claim 1, wherein an adhesive layer is also disposed at an interface between the LiTaO$_3$ substrate and the SiO$_2$ film.

6. A surface acoustic wave device according to claim 1, wherein an adhesive layer is disposed on an upper surface of the IDT and is disposed at the entire interface between the SiO$_2$ film and the IDT.

7. A surface acoustic wave device according to claim 1, wherein the surface acoustic wave device uses a leakage surface acoustic wave primarily including a shear horizontal wave as the surface acoustic wave.

8. A surface acoustic wave device comprising:
    a 42° to 50° rotation-Y plate LiTaO$_3$ substrate having Euler angles of (0°, 132° to 140°, 0°);
    at least one IDT disposed on the LiTaO$_3$ substrate and made of a metal having a density higher than that of Al; and
    a SiO$_2$ film arranged on the LiTaO$_3$ substrate so as to cover the at least one IDT;
wherein
    the at least one IDT primarily includes at least one metal selected from the group consisting of Au, Pt, W, Ta, Ag, Mo, Cu, Ni, Go, Cr, Fe, Mn, Zn, and Ti; and
    the SiO$_2$ film has a thickness normalized by the wavelength of the surface acoustic wave in the range of about 0.03 to about 0.45.

9. A surface acoustic wave device according to claim 8, wherein the IDT is made of Au and has a thickness normalized by the wavelength of a surface acoustic wave in the range of about 0.013 to about 0.030.

10. A surface acoustic wave device according to claim 8, wherein an adhesive layer is also disposed at an interface between the LiTaO$_3$ substrate and the SiO$_2$ film.

11. A surface acoustic wave device according to claim 8, wherein an adhesive layer is disposed on an upper surface of the IDT and is disposed at the entire interface between the SiO$_2$ film and the IDT.

12. A surface acoustic wave device according to claim 8, wherein the surface acoustic wave device uses a leakage surface acoustic wave primarily including a shear horizontal wave as the surface acoustic wave.

13. A surface acoustic wave device comprising:
    a 25° to 42° rotation-Y plate LiTaO$_3$ substrate having Euler angles of (0°, 115° to 132°, 0°);
    at least one IDT disposed on the LiTaO$_3$ substrate and made of a metal having a density higher than that of Al; and a SiO$_2$ film arranged on the LiTaO$_3$ substrate so as to cover the at least one IDT; wherein
    the at least one IDT primarily includes at least one metal selected from the group
    consisting of Au, Pt, W, Ta, Ag, Mo, Cu, Ni, Go, Cr, Fe, Mn, Zn, and Ti; and
    the SiO$_2$ film has a thickness normalized by the wavelength of the surface acoustic wave in the range of about 0.03 to about 0.45.

14. A surface acoustic wave device according to claim 13, wherein the IDT is made of Au and has a thickness normalized by the wavelength of a surface acoustic wave in the range of about 0.013 to about 0.030.

15. A surface acoustic wave device according to claim 13, wherein an adhesive layer is also disposed at an interface between the LiTaO$_3$ substrate and the SiO$_2$ film.

16. A surface acoustic wave device according to claim 13, wherein an adhesive layer is disposed on an upper surface of the IDT and is disposed at the entire interface between the SiO$_2$ film and the IDT.

17. A surface acoustic wave device according to claim 13, wherein the surface acoustic wave device uses a leakage surface acoustic wave primarily including a shear horizontal wave as the surface acoustic wave.

* * * * *